(12) United States Patent
Imamoto et al.

(10) Patent No.: US 10,679,706 B2
(45) Date of Patent: Jun. 9, 2020

(54) SEMICONDUCTOR STORAGE DEVICE

(71) Applicant: Toshiba Memory Corporation, Tokyo (JP)

(72) Inventors: Akihiro Imamoto, Yokohama Kanagawa (JP); Akio Sugahara, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/286,531

(22) Filed: Feb. 26, 2019

(65) Prior Publication Data

US 2020/0090758 A1 Mar. 19, 2020

(30) Foreign Application Priority Data

Sep. 13, 2018 (JP) ................................. 2018-171686

(51) Int. Cl.
*G11C 7/00* (2006.01)
*G11C 16/16* (2006.01)
*G11C 16/04* (2006.01)
*G11C 16/26* (2006.01)
*G11C 7/10* (2006.01)

(52) U.S. Cl.
CPC .......... *G11C 16/16* (2013.01); *G11C 16/0483* (2013.01); *G11C 16/26* (2013.01); *G11C 7/10* (2013.01)

(58) Field of Classification Search
CPC ...... G11C 16/26; G11C 16/16; G11C 16/0483
See application file for complete search history.

(56) References Cited

U.S. PATENT DOCUMENTS

| 9,053,810 | B2 | 6/2015 | Dutta et al. |
| 9,589,659 | B1 | 3/2017 | Vali et al. |
| 2017/0186484 | A1 | 6/2017 | Takada et al. |
| 2018/0150400 | A1* | 5/2018 | Agarwal ............. G11C 11/5628 |
| 2019/0088340 | A1* | 3/2019 | Shirakawa ............ G11C 16/26 |
| 2019/0115081 | A1* | 4/2019 | Lee ....................... G11C 16/08 |

* cited by examiner

*Primary Examiner* — Uyen Smet
(74) *Attorney, Agent, or Firm* — Kim & Stewart LLP

(57) ABSTRACT

A semiconductor storage device includes first and second planes each including a plurality of memory cells, an input/output circuit configured to receive data to be written in the memory cells from a controller, and a control circuit. The first plane includes a first sense amplifier circuit electrically connected to a first memory cell of the first plane and a first latch circuit connected in series between the input/output circuit and the first sense amplifier circuit. The control circuit is configured to carry out a first write operation on the first memory cell using the first latch circuit in response to a first command, and while carrying out the first write operation on the first memory cell, accept a second command to carry out a second write operation on a second memory cell of the second plane before use of the first latch circuit during the first write operation has ended.

20 Claims, 12 Drawing Sheets

SEMICONDUCTOR STORAGE DEVICE

CROSS-REFERENCE TO RELATED APPLICATIONS

This application is based upon and claims the benefit of priority from Japanese Patent Application No. 2018-171686, filed Sep. 13, 2018, the entire contents of which are incorporated herein by reference.

FIELD

Embodiments described herein relate generally to a semiconductor storage device.

BACKGROUND

A NAND type flash memory is known as one type of semiconductor storage device.

DETAILED DESCRIPTION

Figure 1:
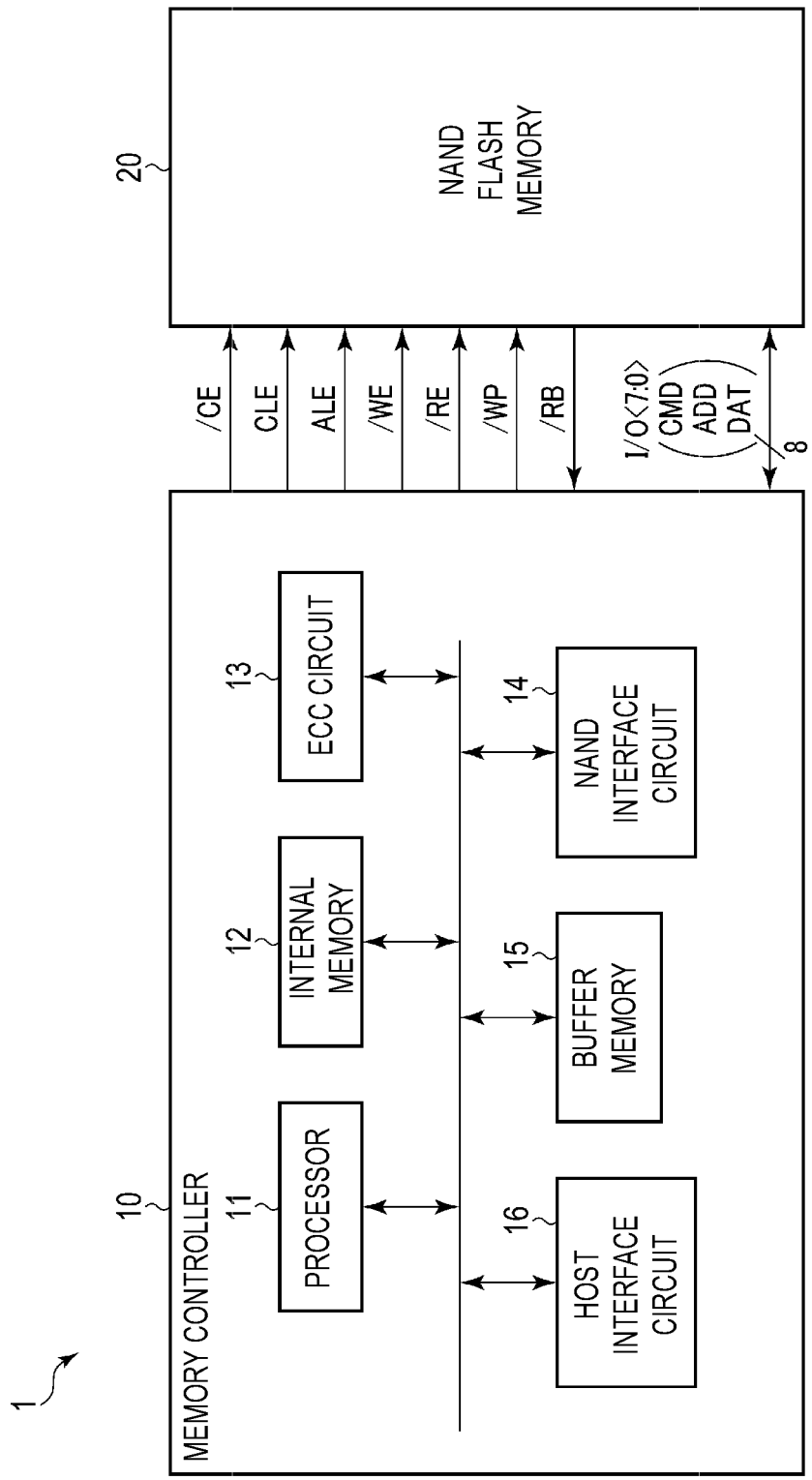
FIG. 1 is a block diagram illustrating the configuration of a memory system according to a first embodiment.

In general, according to one embodiment, a semiconductor storage device according to an embodiment includes a first plane and a second plane each including a memory cell array that includes plural memory cells, an input/output circuit configured to receive data to be written in the memory cell array from a controller, and a control circuit. The first plane further includes a first sense amplifier circuit electrically connected a first memory cell of the first plane and a first latch circuit connected in series between the input/output circuit and the first sense amplifier circuit. The control circuit is configured to carry out a first write operation on the first memory cell using the first latch circuit in response to a first command, and while carrying out the first write operation on the first memory cell, accept a second command to carry out a second write operation on a second memory cell of the second plane before use of the first latch circuit during the first write operation has ended.

Hereinafter, embodiments will be described with reference to the drawings. In the following description, elements having the same function and configuration are denoted by common reference numerals. Further, when plural elements having common reference numerals are distinguished from each other, suffixes are added to the common reference numerals. In addition, when such elements are not required to be distinguished from each other, they are referred to using only the common reference numerals, and without any suffix attached thereto.

1. First Embodiment

A semiconductor storage device according to a first embodiment will be described.

1.1 Configuration

First, descriptions will be made on the configuration of the semiconductor storage device according to the first embodiment.

1.1.1 Overall Configuration of Memory System

FIG. 1 is a block diagram illustrating an example of the configuration of a memory system including the semiconductor storage device according to the first embodiment. The memory system 1 communicates with, for example, an external host device (not illustrated). The memory system 1 stores data from a host device (not illustrated) and also reads the stored data for return to the host device.

As illustrated in FIG. 1, the memory system 1 includes a memory controller 10 and a semiconductor storage device (e.g., NAND flash memory) 20. The memory controller 10 receives a command from the host device and controls the semiconductor storage device 20 based on the received command. Specifically, the memory controller 10 writes the data which is instructed to be written from the host device to the semiconductor storage device 20, reads the data which is instructed to be read from the host device from the semiconductor storage device 20, and transmits the read data to the host device. The memory controller 10 is connected to the semiconductor storage device 20 by a NAND bus. The semiconductor storage device 20 includes plural memory cells, and stores data in a nonvolatile manner.

The NAND bus transmits and receives the signals /CE, CLE, ALE, /WE, /RE, /WP, /RB, and I/O<7:0> according to the NAND interface standard via individual signal lines. The signal /CE is a chip enable signal by which the semiconductor storage device 20 can be enabled. The signal CLE notifies the semiconductor storage device 20 that the signal I/O<7:0> which is transmitted to the semiconductor storage device 20 is a command while the signal CLE is at the level "H (High)." The signal ALE notifies the semiconductor storage device 20 that the signal I/O<7:0> which is transmitted to the semiconductor storage device 20 is an address while the signal ALE is at the level "H." The signal /WE instructs the semiconductor storage device 20 to receive the signal I/O<7:0> which is transmitted to the semiconductor storage device 20 while the signal /WE is at the level "L (Low)." The signal /RE instructs the semiconductor storage device 20 to output the signal I/O<7:0> therefrom. The signal /WP instructs the semiconductor storage device 20 to prohibit data writing and erasing. The signal /RB indicates whether the semiconductor storage device 20 is in a ready state (a state in which an external command can be received) or a busy state (a state in which no external command can be received). The signal I/O<7:0> is, for example, an 8-bit signal. The signal I/O<7:0> represents a data entity transmitted and received between the semiconductor storage device 20 and the memory controller 10, and includes a command CMD, an address ADD, and data DAT. The data DAT includes write data and read data.

1.1.2 Configuration of Memory Controller

Next, the memory controller of the memory system according to the first embodiment will be described with reference to FIG. 1. The memory controller 10 includes a processor (e.g., CPU: central processing unit) 11, an internal memory (e.g., RAM: random access memory) 12, an ECC (error check and correction) circuit 13, a NAND interface circuit 14, a buffer memory 15, and a host interface circuit 16.

The processor 11 controls the entire operation of the memory controller 10. The processor 11 issues a read command based on the NAND interface to the semiconductor storage device 20, for example, in response to a data read command received from the host device. Similarly, the processor 11 controls the writing and erasing operations in response to a data write command and a data erase command received from the host device. The processor 11 also performs various calculations on the data read from the semiconductor storage device 20.

The internal memory 12 is, for example, a semiconductor memory such as a DRAM (dynamic RAM) and is used as a work area of the processor 11. The internal memory 12 stores firmware that is executed by the processor 11 to manage the semiconductor storage device 20, various management tables, and the like.

An ECC circuit 13 performs an error detection and error correction processing. More specifically, at the time of writing data, an ECC code is generated for each set having a certain amount of data, from the data received from the host device. Further, at the time of reading data, ECC decoding is performed based on the ECC code, and the presence or absence of an error is detected. When an error is detected, the bit position of the error is determined and the error is corrected.

The NAND interface circuit 14 is connected to the semiconductor storage device 20 via the NAND bus and performs communication with the semiconductor storage device 20. The NAND interface circuit 14 transmits the command CMD, the address ADD, and the write data to the semiconductor storage device 20 according to the instruction of the processor 11. Further, the NAND interface circuit 14 receives the data read from the semiconductor storage device 20.

The buffer memory 15 temporarily stores data and the like received by the memory controller 10 from the semiconductor storage device 20 and the host device. The buffer memory 15 is also used, for example, as a storage area that temporarily stores the data read from the semiconductor storage device 20, calculation results for the read data, and the like.

The host interface circuit 16 is connected to the host device and performs communication with the host device. The host interface circuit 16 transfers, for example, commands and data received from the host device to the processor 11 and the buffer memory 15, respectively.

1.1.3 Configuration of Semiconductor Storage Device

Figure 2:
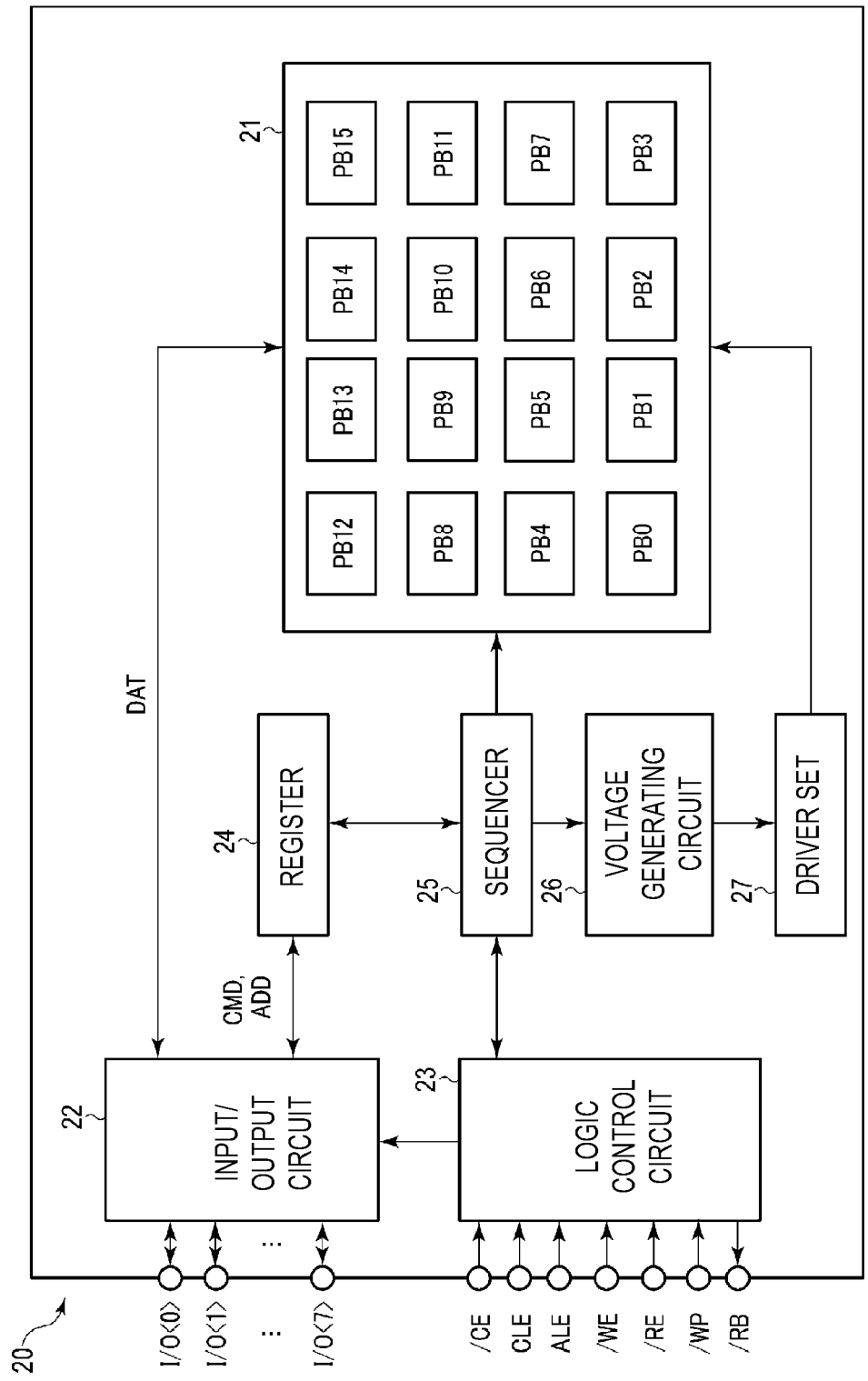
FIG. 2 is a block diagram illustrating the configuration of a semiconductor storage device according to the first embodiment.

Next, descriptions will be made on a configuration example of the semiconductor storage device according to the first embodiment. FIG. 2 is a block diagram illustrating an example of the configuration of the semiconductor storage device according to the first embodiment.

FIG. 2 is a block diagram illustrating an example of the configuration of the semiconductor storage device according to the first embodiment. As illustrated in FIG. 2, the semiconductor storage device 20 includes a core unit 21, an input/output circuit 22, a logic control circuit 23, a register 24, a sequencer 25, a voltage generating circuit 26, and a driver set 27.

The core unit 21 includes, for example, 16 planes PB (PB0, PB1, . . . , PB15). Each plane PB performs the above-described various operations on a block (not illustrated) including plural memory cell transistors (not illustrated). Specifically, for example, each plane PB performs a data write operation and a data read operation for a portion of memory cell transistors in a certain block, and performs a data erase operation for all the memory cell transistors in the certain block. In addition, each of the planes PB0 to PB15 in the present embodiment has the same configuration except as otherwise noted below. Details of the configuration of the plane PB will be described later.

The input/output circuit 22 transmits and receives signals I/O<7:0> with the memory controller 10. The input/output circuit 22 transfers the command CMD and the address ADD in the signals I/O<7:0> to the register 24. Further, the input/output circuit 22 transmits and receives write data and read data (both which are generally referred to herein as data DAT) to and from the core unit 21.

The logic control circuit 23 receives the signals /CE, CLE, ALE, /WE, /RE, and /WP from the memory controller 10. Further, the logic control circuit 23 transfers the signal /RB to the memory controller 10 and notifies the state of the semiconductor storage device 20 to the outside.

The register 24 stores the command CMD and the address ADD. The register 24 transfers, for example, the address ADD and the command CMD to the sequencer 25.

The sequencer 25 receives a command set including the command CMD and the address ADD and controls the semiconductor storage device 20 in accordance with the sequence based on the received command set. The sequencer 25 may output a control signal, for example, to synchronize plural planes PB in the core unit 21, when executing a data read operation, a data write operation, or a data erase operation.

The voltage generating circuit 26 generates a voltage necessary for a data write operation, a data read operation, and a data erase operation based on the instruction from the sequencer 25. The voltage generating circuit 26 supplies the generated voltage to the driver set 27.

The driver set 27 includes plural drivers, and supplies various voltages from the voltage generating circuit 26 to the core unit 21 based on the address from the register 24.

1.1.4 Configuration of Plane

Next, descriptions will be made on the configuration of the plane of the semiconductor storage device according to the first embodiment.

Figure 3:
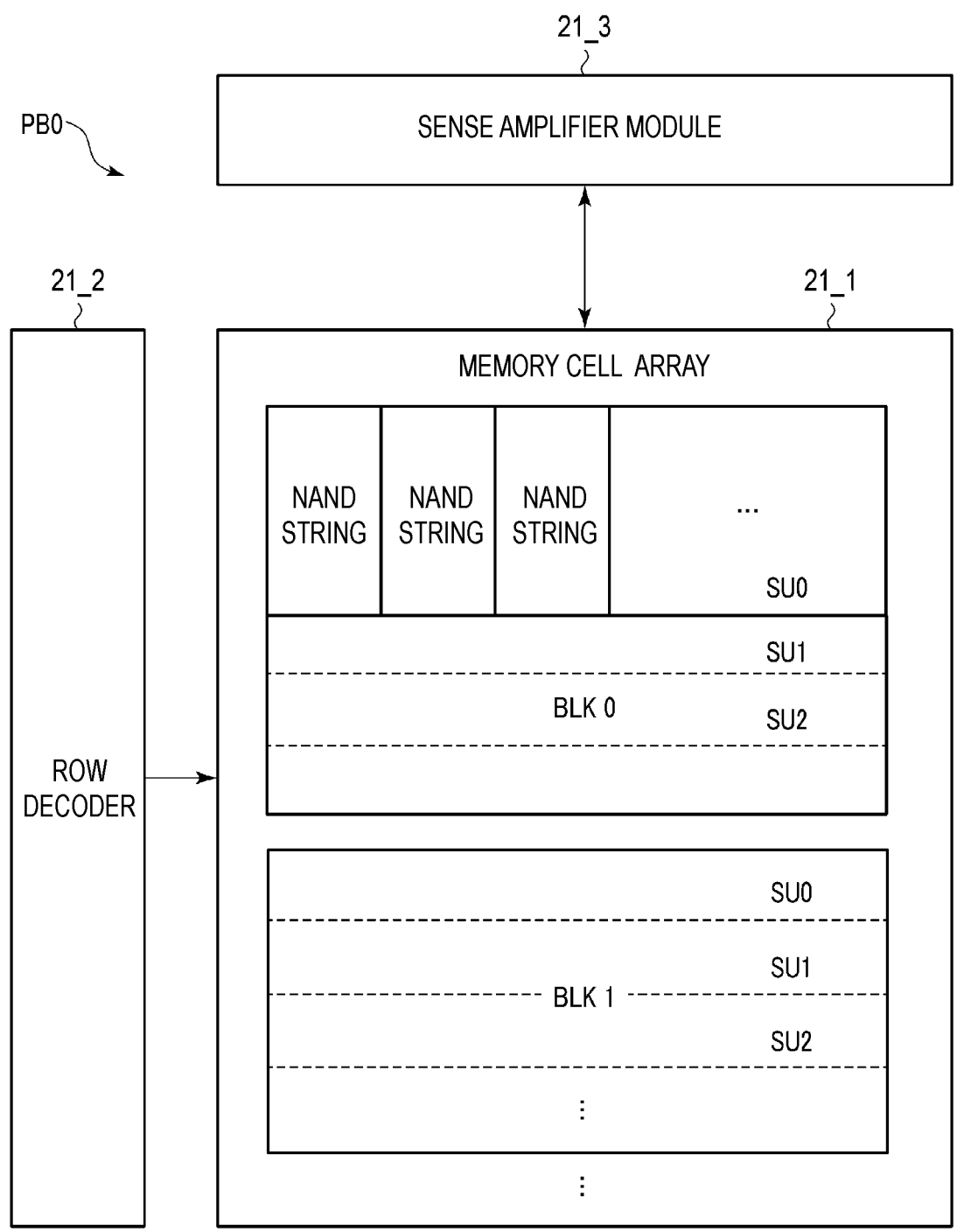
FIG. 3 is a block diagram illustrating a plane of the semiconductor storage device according to the first embodiment.

FIG. 3 is a block diagram illustrating an example of the configuration of a plane of the semiconductor storage device according to the first embodiment. In FIG. 3, a plane PB0 is illustrated as an example, and the other planes PB have the same configuration.

As illustrated in FIG. 3, the plane PB0 includes a memory cell array 21_1, a row decoder 21_2, and a sense amplifier module 21_3.

The memory cell array 21_1 includes plural blocks BLK (BLK0, BLK1, . . . ). Each block BLK is identified, for example, by block addresses that are uniquely assigned. Also, each of the other planes PB includes blocks having the same block addresses as the plane PB0. The blocks BLK to which the same block address is assigned across different planes PB are distinguished from each other by unique plane addresses. The block BLK includes plural nonvolatile memory cell transistors associated with word lines and bit lines (not illustrated). The block BLK is, for example, a data erase unit, and the data in the same block BLK is collectively erased. Each block BLK includes plural string units SU (SU0, SU1, . . . ). Each string unit SU includes plural NAND strings NS. The number of blocks in the memory cell array 21_1, the number of string units in one block BLK, and the number of NAND strings in one string unit SU may be set to any number.

The row decoder 21_2 selects the block BLK or the like based on the block address among the addresses ADD stored in the register 24. Then, a voltage from the driver set 27 is transferred to the selected block BLK via the row decoder 21_2.

The sense amplifier module 21_3 reads data by sensing the threshold voltage of the memory cell transistor and transfers the read data to the input/output circuit 22 at the time of reading the data. The sense amplifier module 21_3 controls the bit line connected to the memory cell transistor at the time of writing the data into the memory cell transistor. Further, the sense amplifier module 21_3 receives the column address of the address ADD from the register 24, and outputs the data of the column based on the column address.

1.1.5 Circuit Configuration of Memory Cell Array

Figure 4:
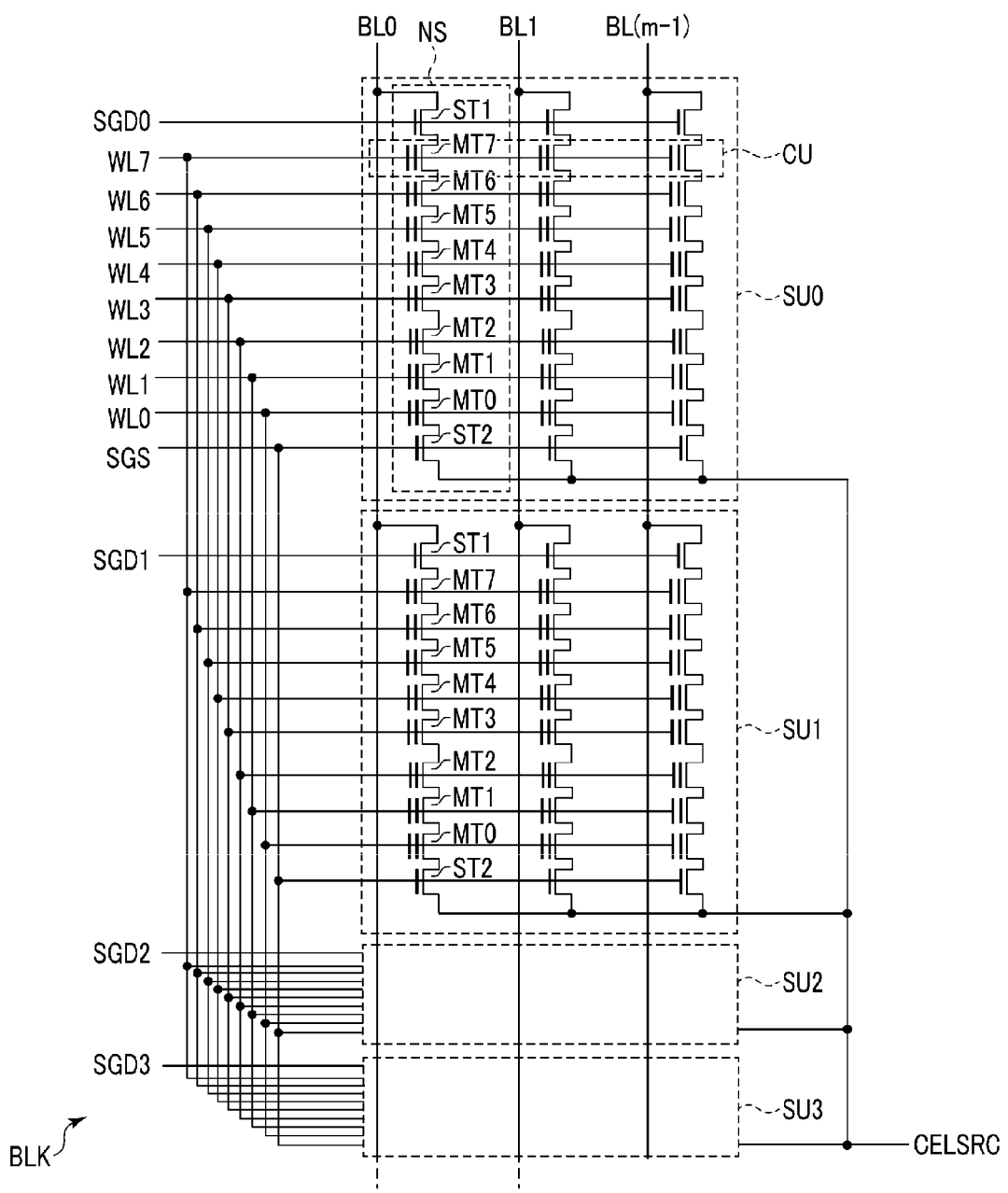
FIG. 4 is a circuit diagram illustrating the configuration of a memory cell array of a semiconductor storage device according to the first embodiment.

Next, a circuit configuration of the memory cell array of the semiconductor storage device according to the first embodiment will be described with reference to FIG. 4. FIG. is an example of a circuit diagram illustrating the configuration of a memory cell array of the semiconductor storage device according to the first embodiment. FIG. 4 illustrates a circuit diagram of one block BLK in the memory cell array 21_1.

As illustrated in FIG. 4, each string unit SU includes a set of NAND strings NS. Each of the NAND strings NS includes, for example, eight (8) memory cell transistors MT (MT0 to MT7), a select transistor ST1, and a select transistor ST2. The number of the memory cell transistors MT is not limited to eight (8), and the number may be 16, 32, 64, 96, 128, etc. and is not limited to any one particular number. The memory cell transistor MT includes a stacked gate including a control gate and a charge storage layer. Each memory cell transistor MT is connected in series between the select transistors ST1 and ST2. Further, in the following description, the term "connect" includes the case where other conductive elements are interposed.

In a certain block BLK, the gates of the select transistors ST1 of the string units SU0 to SU3 are connected to the select gate lines SGD0 to SGD3, respectively. The gates of the select transistors ST2 of all the string units SU in the block BLK are commonly connected to the select gate line SGS. The control gates of the memory cell transistors MT0 to MT7 in the same block BLK are connected to the word lines WL0 to WL7, respectively. That is, the word lines WL of the same address are commonly connected to all the string units SU in the same block BLK, and the select gate line SGS is commonly connected to all the string units SU in the same block BLK. In the meantime, the select gate line SGD is connected to only one of the string units SU in the same block BLK.

Among the NAND strings NS arranged in a matrix form in the memory cell array 21_1, the other end of the select transistor ST1 of the NAND string NS in the same row is connected to any one of m bit lines BL (BL0 to BL(m−1) (m is a natural number)). The bit line BL is commonly connected to the NAND string NS in the same column across the plural blocks BLK.

The other end of the select transistor ST2 is connected to a source line CELSRC. The source line CELSRC is commonly connected to plural NAND strings NS across plural blocks BLK.

As described above, data erasing is performed collectively, for example, for the memory cell transistors MT in the same block BLK. In contrast, data reading and writing may be performed collectively for plural memory cell transistors MT commonly connected to any one word line WL in anyone string unit SU of any one block BLK. A set of the memory cell transistors MT sharing the word line WL in the one string unit SU is referred to, for example, as a cell unit CU. That is, the cell unit CU is a set of memory cell transistors MT for which collective writing or reading operation may be performed.

Further, one memory cell transistor MT may store, for example, one or plural bits of data. In the same cell unit CU, a set of one bit stored in the same bit position by each memory cell transistor MT is called a "page." In other words, the term. "page" may be defined as a portion of the memory space formed in the set of the memory cell transistors MT in the same cell unit CU.

In the following description, descriptions will be made on a case where one bit of data may be stored in one memory cell transistor MT for simplification.

Figure 5:
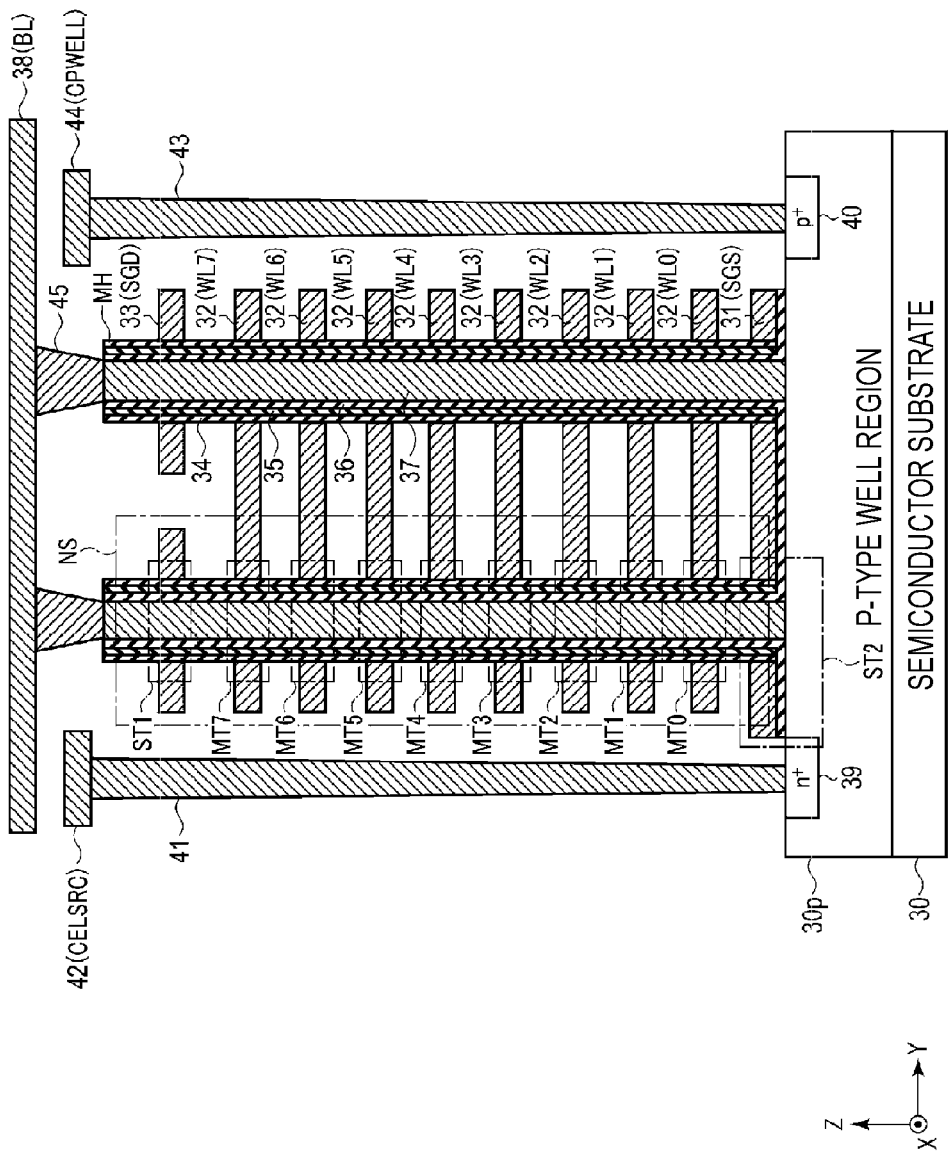
FIG. 5 is a cross-sectional view illustrating the configuration of a memory cell array of the semiconductor storage device according to the first embodiment.

Next, a cross-sectional structure of the memory cell array 21_1 will be described with reference to FIG. 5. FIG. 5 illustrates an example of the cross-sectional structure of a portion of the memory cell array of the semiconductor storage device according to the first embodiment. Particularly, FIG. 5 illustrates a portion with two string units SU in one block BLK. Specifically, FIG. 5 illustrates two NAND strings NS, one for each of two string units SU, and surrounding portions thereof. Plural configurations illustrated in FIG. 5 are arranged in the X direction, and for example, a set of plural NAND strings NS arranged in the X direction corresponds to one string unit SU.

The memory cell array 21_1 is provided on a semiconductor substrate 30. In the following description, a plane parallel to the surface of the semiconductor substrate 30 is defined as an XY plane, and a direction perpendicular to the XY plane is defined as a Z direction. The X direction and the Y direction are assumed to be perpendicular to each other.

A p-type well region 30p is provided on an upper region of the semiconductor substrate 30. Plural NAND strings NS are provided on the p-type well region 30p. That is, for example, a wiring layer 31 functioning as a select gate line SGS, eight-layer wiring layers 32 functioning as word lines WL0 to WL7 (WL0 to WL7), and a wiring layer 33 functioning as a select gate line SGD are sequentially stacked on the p-type well region 30p. Plural wiring layers 31 and plural wiring layers 33 may be stacked. An insulating film (not illustrated) is provided between the stacked wiring layers 31 to 33.

The wiring layer 31 is commonly connected, for example, to the gate of the select transistor ST2 of each of the plural NAND strings NS in one block BLK. The wiring layer 32 is commonly connected to the control gate of the memory cell transistor MT of each of the plural NAND strings NS in one block BLK for each layer. The wiring layer 33 is commonly connected to the gate of the select transistor ST1 of each of the plural NAND strings NS in one string unit SU.

A memory hole MH passes through the wiring layers 33, 32, 31 and reach the p-type well region 30p. On the side surface of the memory hole MH, a block insulating film 34, a charge storage layer (e.g., an insulating film) 35, and a tunnel oxide film 36 are provided in this order. A semiconductor filler (e.g., conductive film) 37 is embedded in the memory hole MH. The semiconductor filler 37 is, for example, undoped polysilicon and functions as a current path for the NAND string NS. A wiring layer 38 functioning as a bit line BL is provided above the semiconductor filler 37. The semiconductor filler 37 and the wiring layer 38 are connected through a contact plug 45.

As described above, the select transistor ST2, the plural memory cell transistors MT, and the select transistor ST1 are sequentially stacked above the p-type well region 30p, and one memory hole MH corresponds to one NAND string NS.

An n+-type impurity diffusion region 39 and a p+-type impurity diffusion region 40 are provided in the upper portion of the p-type well region 30p. A contact plug 41 is provided on the upper surface of the n+-type impurity diffusion region 39. A wiring layer 42 functioning as a source line CELSRC is provided on the upper surface of the contact plug 41. A contact plug 43 is provided on the upper surface of the p+-type impurity diffusion region 40. A wiring layer 44 functioning as a well line CPWELL is provided on the upper surface of the contact plug 43.

Further, the memory cell array 21_1 may have other configurations, such as, for example, the configurations described in U.S. patent application Ser. No. 12/407,403, filed on Mar. 19, 2009 and entitled "Three-Dimensional Stacked Nonvolatile Semiconductor Memory," U.S. patent application Ser. No. 12/406,524, filed on Mar. 18, 2009 and entitled "Three-Dimensional Stacked Nonvolatile Semiconductor Memory," U.S.patent application Ser. No. 12/679,991, filed on Mar. 23, 2009 and entitled "Nonvolatile Semiconductor Storage Device and Manufacturing Method Thereof," and U.S. patent application Ser. No. 12/532,030, filed on Mar. 25, 2010 and entitled "Semiconductor Memory and Manufacturing Method Thereof." These patent applications are incorporated herein by reference in their entirety.

1.1.6 Configuration of Sense Amplifier Module

Figure 6:
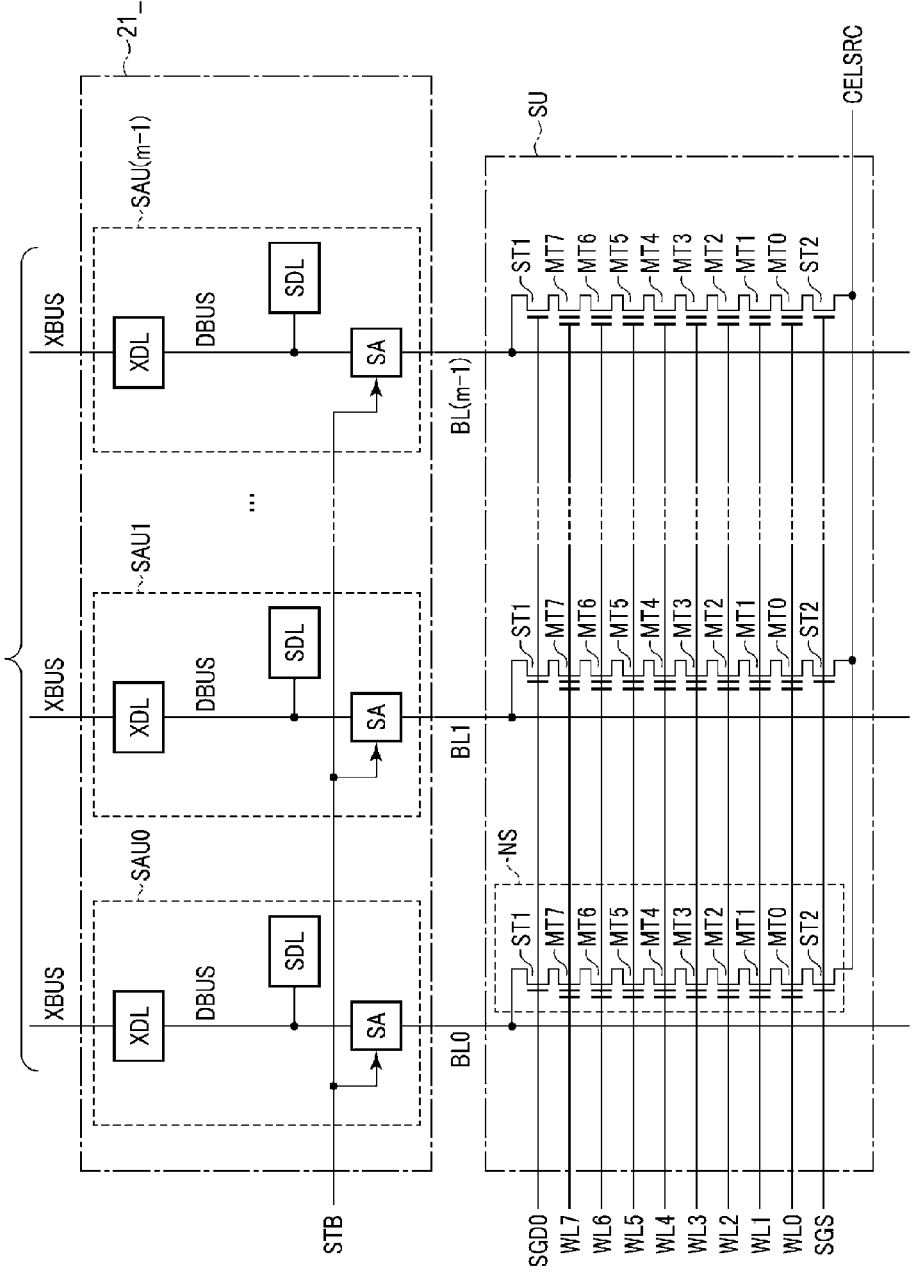
FIG. 6 is a block diagram illustrating the configuration of a sense amplifier module of the semiconductor storage device according to the first embodiment.

Next, descriptions will be made on the configuration of the sense amplifier module of the semiconductor storage device according to the first embodiment. FIG. 6 is a block diagram illustrating an example of the configuration of the sense amplifier module of the semiconductor storage device according to the first embodiment. As illustrated in FIG. 6, the sense amplifier module 21_3 includes sense amplifier units SAU (SAU0, SAU1, . . . , SAU(m−1)) provided for each bit line BL.

Each of the sense amplifier units SAU includes a sense amplifier SA, a latch circuit SDL, and a latch circuit XDL.

The sense amplifier SA is a circuit that reads data by sensing the threshold voltage of the memory cell transistor MT by the voltage or current of a corresponding bit line BL and applies a voltage to the bit line BL again according to the write data. That is, the sense amplifier SA directly controls the bit line BL. In the sense amplifier SA, at the time of reading data, a strobe signal is given via a node STB, for example, by the sequencer 25. The sense amplifier SA determines the read data at the timing at which the strobe signal is asserted and stores the data in the latch circuit SDL.

The latch circuit SDL temporarily stores the read data read by the sense amplifier SA and the write data to be written by the sense amplifier SA. As will be described later, in the sense amplifier unit SAU, the sense amplifier SA includes a node SEN, and the latch circuits SDL and XDL are connected by a bus DBUS. Since the node SEN and the bus DBUS have a large parasitic capacitance, they may be used as a temporary latch. For example, it is possible to perform various logical operations such as a negative (NOT) operation, a logical sum (OR) operation, a logical product (AND) operation, a negative logical product (NAND) operation, a negative logical sum (NOR) operation, and an exclusive logical sum (XOR) operation by temporarily loading the data stored in the latch circuits SDL and XDL onto the node SEN and the bus DBUS.

The sense amplifier SA and the latch circuit SDL are connected to a common node so that data may be exchanged with each other. Further, the latch circuit XDL is connected to the sense amplifier SA and the latch circuit SDL via the bus DBUS.

Input/output of data in the sense amplifier module 21_3 is performed through the latch circuit XDL. That is, the data received from the memory controller 10 is transferred from the input/output circuit 22 to the latch circuit XDL via an input/output bus XBUS, and then transmitted to the latch circuit SDL or the sense amplifier SA. The data of the latch circuit SDL or the sense amplifier SA is transferred to the latch circuit XDL via the bus DBUS and then transmitted to the input/output circuit 22 or the memory controller 10 via the bus XBUS. In this way, the latch circuit XDL functions as a cache memory of the semiconductor storage device 20, which is connected in series between the input/output circuit 22 and the sense amplifier SA. Therefore, even when the latch circuit SDL is in use, when the latch circuit XDL is unused (in an available state), the semiconductor storage device 20 may be in a ready state. In the meantime, when the latch circuit XDL is in use, the semiconductor storage device 20 may not be in a ready state except for a predetermined case such as a pseudo cache program operation (to be described later).

Figure 7:
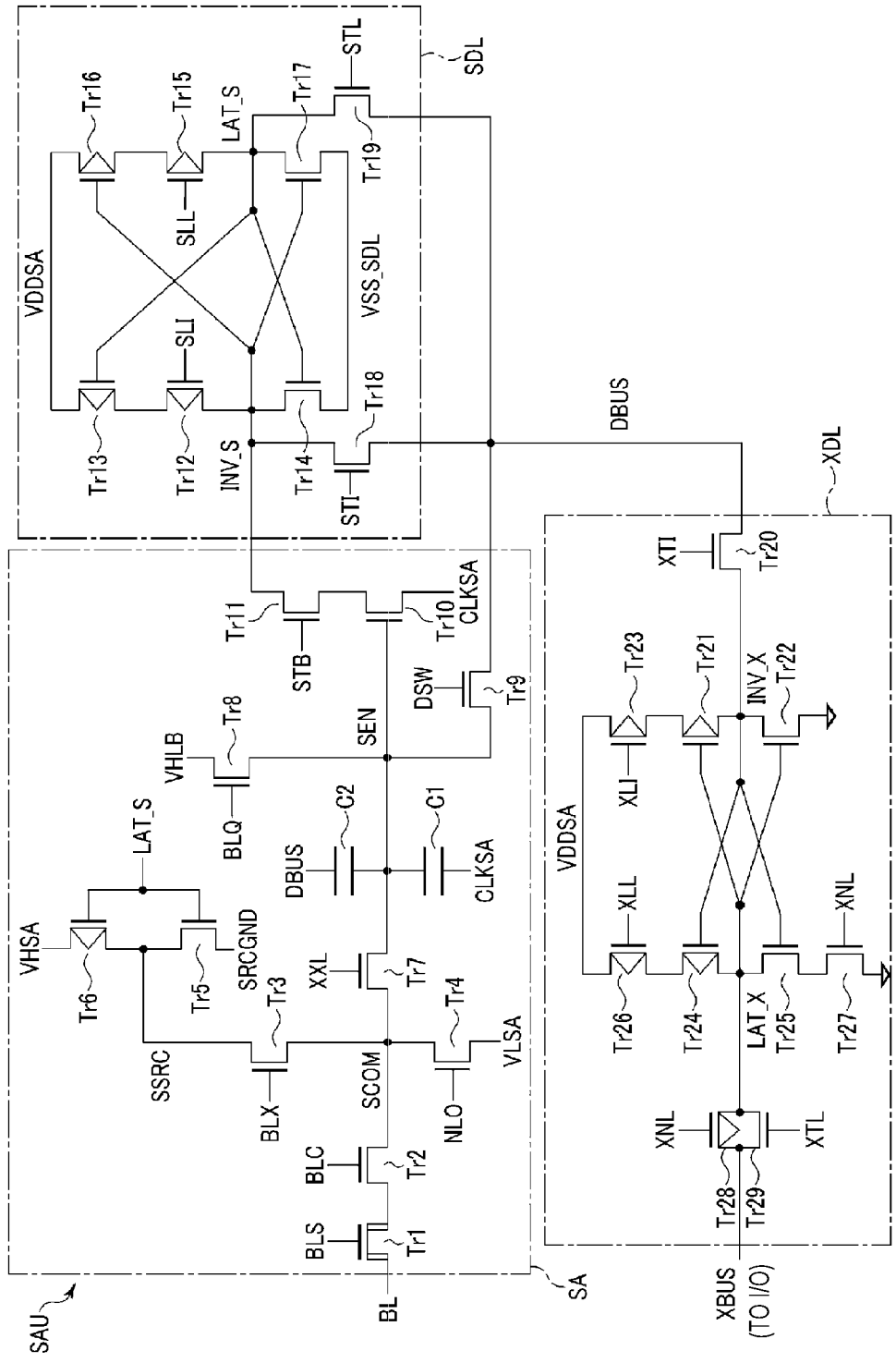
FIG. 7 is a circuit diagram illustrating the configuration of a sense amplifier unit of the semiconductor storage device according to the first embodiment.

FIG. 7 is a circuit diagram illustrating an example of the configuration of a sense amplifier unit of the semiconductor storage device according to the first embodiment. In FIG. 7, the configurations of the sense amplifier SA, the latch circuit SDL, and the latch circuit XDL are illustrated as an example of the sense amplifier units SAU in the sense amplifier module 21_3.

First, descriptions will be made on the configuration of the sense amplifier SA.

As illustrated in FIG. 7, the sense amplifier SA includes transistors Tr1, Tr2, Tr3, Tr4, Tr5, Tr6, Tr7, Tr8, Tr9, Tr10, and Tr11, and capacitors C1 and C2. The transistors Tr1 to Tr5 and Tr7 to Tr11 have, for example, an n-type polarity, and the transistor Tr6 has, for example, a p-type polarity.

The transistor Tr1 is, for example, a transistor of high breakdown voltage, and includes a first end connected to the bit line BL, a second end connected to a first end of the transistor Tr2, and a gate connected to a node BLS. The transistor Tr2 includes a second end connected to a node SCOM and a gate connected to a node BLC.

The transistor Tr3 includes a first end connected to the node SCOM, a second end connected to a node SSRC, and a gate connected to a node BLX. The transistor Tr4 includes a first end connected to the node SCOM, a second end connected to a node VLSA, and a gate connected to a node NLO.

The transistor Tr5 includes a first end connected to the node SSRC, a second end connected to a node SRCGND, and a gate connected to a node LAT_S. The transistor Tr6 includes a first end connected to the node SSRC, a second end connected to a node VHSA, and a gate connected to the node LAT_S.

The transistor Tr7 includes a first end connected to the node SCOM, a second end connected to the node SEN, and a gate connected to a node XXL. The capacitor C1 includes a first end connected to the node SEN and a second end connected to a node CLKSA. The capacitor C2 includes a first end connected to the node SEN and a second end connected to the bus DBUS.

The transistor Tr8 includes a first end connected to the node SEN, a second end connected to a node VHLB, and a gate connected to a node BLQ. The transistor Tr9 includes a first end connected to the node SEN, a second end connected to the bus DBUS, and a gate connected to a node DSW.

The transistor Tr10 includes a first end connected to the node CLKSA, a second end connected to a first end of the transistor Tr11, and a gate connected to the node SEN. The transistor Tr11 includes a second end connected to a node INV_S and a gate connected to the node STB.

Next, the configuration of the latch circuit SDL will be described with reference to FIG. 7.

The latch circuit SDL includes transistors Tr12, Tr13, Tr14, Tr15, Tr16, Tr17, Tr18, and Tr19. The transistors Tr14 and Tr17 to Tr19 have, for example, an n-type polarity, and the transistors Tr12, Tr13, Tr15 and Tr16 have, for example, a p-type polarity.

The transistor Tr12 includes a first end connected to the node INV_S, a second end connected to a first end of the transistor Tr13, and a gate connected to a node SLI. The transistor Tr13 includes a second end connected to a node VDDSA and a gate connected to the node LAT_S. The transistor Tr14 includes a first end connected to the node INV_S, a second end connected to a node VSS_SDL, and a gate connected to the node LAT_S.

The transistor Tr15 includes a first end connected to the node LAT_S, a second end connected to a first end of the transistor Tr16, and a gate connected to a node SLL. The transistor Tr16 includes a second end connected to the node VDDSA and a gate connected to the node INV_S. The transistor Tr17 includes a first end connected to the node LAT_S, a second end connected to the node VSS_SDL, and a gate connected to the node INV_S.

The transistor Tr18 includes a first end connected to the node INV_S, a second end connected to the bus DBUS, and a gate connected to a node STI. The transistor Tr19 includes a first end connected to the node LAT_S, a second end connected to the bus DBUS, and a gate connected to the node STL.

Next, the configuration of the latch circuit XDL will be described with reference to FIG. 7.

The latch circuit XDL includes transistors Tr20, Tr21, Tr22, Tr23, Tr24, Tr25, Tr26, Tr27, Tr28, and Tr29. The transistors Tr20, Tr22, Tr25, Tr27, and Tr29 have, for example, an n-type polarity. The transistors Tr21, Tr23, Tr24, Tr26, and Tr28 have, for example, a p-type polarity.

The transistor Tr20 includes a first end connected to the bus DBUS, a second end connected to a node INV_X, and a gate connected to a node XTI.

The transistor Tr21 includes a first end connected to the node INV_X, a second end connected to a first end of the transistor Tr23, and a gate connected to a node LAT_X. The transistor Tr22 includes a first end connected to the node INV_X, a grounded second end, and a gate connected to the node LAT_X. The transistor Tr23 includes a second end connected to the node VDDSA and a gate connected to a node XLI.

The transistor Tr24 includes a first end connected to the node LAT_X, a second end connected to a first end of the transistor Tr26, and a gate connected to the node INV_X. The transistor Tr25 includes a first end connected to the node LAT_X, a second end connected to a first end of the transistor Tr27, and a gate connected to the node INV_X. The transistor Tr26 includes a second end connected to the node VDDSA and a gate connected to a node XLL. The transistor Tr27 includes a grounded second end and a gate connected to a node XNL.

The transistor Tr28 includes a first end connected to the node LAT_X, a second end connected to the bus XBUS, and a gate connected to the node XNL. The transistor Tr29 includes a first end connected to the node LAT_X, a second end connected to the bus XBUS, and a gate connected to a node XTL. The bus XBUS is used as a path that transfers the signal I/O.

With the above-described configuration, the sense amplifier unit SAU may function as a data transmission/reception path while providing a latch circuit capable of storing data between the bit line BL and the bus XBUS.

1.2 Pseudo Cache Program Operation

Next, descriptions will be made on the operation of the pseudo cache program in the semiconductor storage device according to the first embodiment. During the cache program operation, in the sense amplifier unit SAU of the sense amplifier module 21_3, the sense amplifier SA, during a period in which a write operation for a certain page (e.g., a first page) is executed based on the write data stored in the latch circuit SDL, executes an operation of inputting write data for another page different from the certain page (e.g., a second page) into the latch circuit XDL. The pseudo cache program operation may be applied to a case where the first page and the second page are to be written to different planes PB.

Figure 8:
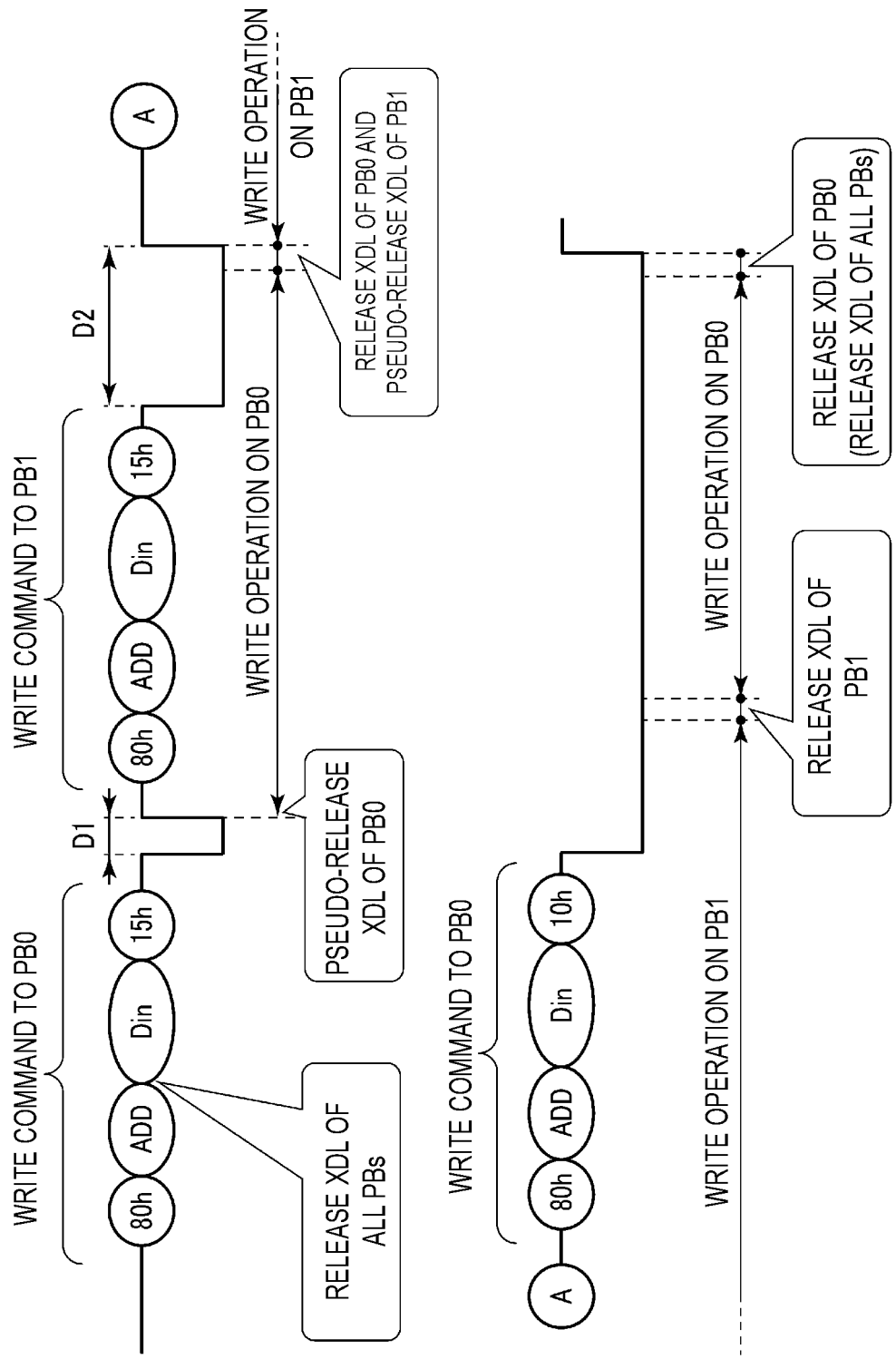
FIG. 8 is a command sequence for a pseudo cache program operation in the semiconductor storage device according to the first embodiment.

FIG. 8 is a command sequence for a pseudo cache program operation in the semiconductor storage device according to the first embodiment. FIG. 8 illustrates, as an example, the case where the write operation on the plane PB0 and the write operation on the plane PB1 are alternately executed in accordance with the sequence of the pseudo cache program operation.

As illustrated in FIG. 8, the memory controller 10 issues and transmits a command "80h" to the semiconductor storage device 20 when the write command has not been transmitted immediately before and the semiconductor storage device 20 is in a ready state. The command "80h" instructs the write operation of data to the semiconductor storage device 20.

The controller 10 issues and transmits an address ADD to the semiconductor storage device 20. For example, the address ADD may be over five cycles. This address ADD designates, for example, the plane PB to be written, the block BLK, and a certain area within the block BLK. In the example of FIG. 8, the sequencer 25 specifies the address of the area in which data is written in the plane PB0 by the address ADD. When the address ADD is stored in the register 24, the sequencer 25 releases the latch circuits XDL in all the planes PB (i.e., resets the data stored in all the latch circuits XDL to "1" to place them in an unused state and make them available for use). As a result, it is possible to prevent an unexpected write operation from being executed in the subsequent write operation. The number of cycles of the address ADD is not limited to five (5) cycles, and any number of cycles is applicable.

Subsequently, the controller 10 transmits write data Din to the semiconductor storage device 20. The controller 10 then issues and transmits, for example, a command "15h" to the semiconductor storage device 20. The command "15h" causes the semiconductor storage device 20 to execute a data write operation based on the address ADD and the write data Din transmitted immediately before. In addition, the command "15h" notifies the semiconductor storage device 20 that the write operation is a cache program operation. A command set including the command "80h," the address ADD, the write data Din, and the command "15h" may be referred to as a "set of first type write commands" herein. In addition, a command set including the command "80h," the address ADD, the write data Din, and a command "11h" (to be described later) may be referred to as a "set of second type write commands" herein. In addition, a command set including the command "80h," the address ADD, the write data Din, and a command "10h" may be referred to as a "set of third type write commands" herein.

When the command "15h" is stored in the register 24, the logic control circuit 23 sets the signal /RB to "L" and notifies the memory controller 10 that the semiconductor storage device 20 is in a busy state. The sequencer 25 inputs the write data Din transmitted from the memory controller 10 into the corresponding latch circuit XDL in the plane PB0. Then, the sequencer 25 moves the write data Din to another latch circuit (e.g., the latch circuit SDL) in the plane PB0. Thereafter, the sequencer 25 controls the voltage generating circuit 26, the row decoder 21_2 of the plane PB0 in the core unit 21, the sense amplifier module 21_3, and the like so as to start the write operation.

Here, the write operation includes a program operation and a verify operation. The program operation is an operation that increases the threshold voltage of the memory cell transistor MT based on the write data Din. The verify operation is an operation that senses the threshold voltage of the memory cell transistor MT after the program operation and determines whether the threshold voltage of the memory cell transistor MT has increased to a desired value. The sequencer 25 continues to alternately execute the program operation and the verify operation until the verify operation is successful.

For this purpose, during the write operation, it is necessary to store the write data Din in at least one latch circuit (e.g., the latch circuit SDL), and to store the read data which is read during the verify operation in the other one latch circuit (e.g., the latch circuit XDL). Therefore, in the semiconductor storage device 20 according to the present embodiment, even when the write data Din is moved from the latch circuit XDL to the latch circuit SDL, the latch circuit XDL is in an in-use state during the write operation.

As described above, when the latch circuit XDL is in use, the semiconductor storage device 20 generally does not go into a ready state. Thus, in the pseudo cache program operation, the sequencer 25 makes the latch circuit XDL in the plane PB0 appear as being available (hereinafter referred to as pseudo-available, and the act of making the latch circuit XDL pseudo-available referred to as pseudo-release) before the write operation on the plane PB0 is completed (e.g., at the same time as the start of the write operation on the plane PB0 after the input of the write data Din into the corresponding latch circuit XDL is completed). Specifically, the sequencer 25 does not reset the data stored in the latch circuit XDL in the plane PB0, and regards the latch circuits XDL in all the planes PB as an unused state (i.e., pseudo-available). In other words, the semiconductor storage device 20 according to the first embodiment not only goes into a ready state when the latch circuits XDL in all the planes PB are in an unused state, but also, after the input of the write data Din into the latch circuits XDL in portions of all the planes PB (e.g., the planes PB), goes into a ready state even when a write operation is being executed in the portions of the planes PB.

As a result, the logic control circuit 23 may set the signal /RB to "H" and notify the memory controller 10 that the semiconductor storage device 20 is in a ready state. Therefore, the memory controller 10 may recognize that the semiconductor storage device 20 is capable of accepting a new command.

Subsequently, the memory controller 10 issues and transmits the command "80h" and the address ADD (over five cycles) to the semiconductor storage device 20. In the example of FIG. 8, the sequencer 25 specifies the address of the area in which data is written in the plane PB1 by the corresponding address ADD.

Subsequently, the controller 10 transmits the write data Din to the semiconductor storage device 20. The controller 10 issues and transmits, for example, a command "15h" to the semiconductor storage device 20. When the command "15h" is stored in the register 24, the logic control circuit 23 sets the signal /RB to "L" and notifies the memory controller 10 that the semiconductor storage device 20 is in a busy state.

The sequencer 25 inputs the write data Din transmitted from the memory controller 10 into the corresponding latch circuit XDL in the plane PB1 while executing the write operation for the plane PB0. Then, the sequencer 25 moves the write data Din to another latch circuit SDL in the plane PB1. The sequencer 25 waits to execute a write operation on the plane PB1 until the write operation on the plane PB0 has completed.

When the write operation on the plane PB0 has completed, the sequencer 25 releases the latch circuit XDL in the plane PB0. As a result, the latch circuit XDL in the plane PB0 may be changed from the in-use state to the unused state. Further, the sequencer 25 starts the write operation on the plane PB1 because the write operation on the plane PB0 has completed. At this time, the sequencer 25 makes pseudo-available the latch circuit XDL in the plane PB1. Specifically, the sequencer 25 does not reset the data stored in the latch circuit XDL in the plane PB1, and regards the latch circuits XDL in all the planes PB as an unused state. As a result, the logic control circuit 23 may set the signal /RB to "H" and notify the memory controller 10 that the semiconductor storage device 20 is in a ready state. Therefore, the memory controller 10 may recognize that the semiconductor storage device 20 is capable of accepting a new command.

When the write command to the plane PB0 is received when the write command has not been transmitted immediately before and the semiconductor storage device 20 is in a ready state, after the input of the write data into the latch circuit XDL in the plane PB0 is completed, the sequencer 25 sets the signal /RB to level "H" to the logic control circuit 23 and notifies the memory controller 10 that the semiconductor storage device 20 is in a ready state. Meanwhile, when the write command to the plane PB1 is received while the write operation is being executed in response to reception of the write command to the plane PB0, after the input of the write data into the latch circuit XDL in the plane PB1 is completed and the write operation on the plane PB0 is completed, the sequencer 25 sets the signal /RB to the level "H" to the logic control circuit 23 and notifies the memory controller 10 that the semiconductor storage device 20 is in a ready state.

In other words, in the semiconductor storage device 20 according to the first embodiment, a first period D1 required from receiving the set of first type write commands for a certain plane (plane PB0) (including "15h") to returning to the ready state is shorter than a second period D2 required from thereafter receiving the set of first type write commands for the other plane (plane PB1) to again returning to the ready state.

Subsequently, the memory controller 10 issues and transmits the command "80h" and the address ADD (over five cycles) to the semiconductor storage device 20. In the example of FIG. 8, the sequencer 25 specifies the address of the area in which data is written in the plane PB0 by the corresponding address ADD.

Subsequently, the controller 10 transmits the write data Din to the semiconductor storage device 20. The controller then issues and transmits the command "10h" to the semiconductor storage device 20. The command"10h" causes the semiconductor storage device 20 to execute a data write operation based on the address ADD and the write data Din transmitted immediately before. Further, the command "10h" notifies the semiconductor storage device 20 that further write operation will not be instructed until this cache program operation has ended.

When the command "10h" is stored in the register 24, the logic control circuit 23 sets the signal /RB to "L" and notifies the memory controller 10 that the semiconductor storage device 20 is in a busy state.

The sequencer 25 inputs the write data Din transmitted from the memory controller 10 into the corresponding latch circuit XDL in the plane PB0 while executing the write operation on the plane PB1. Then, the sequencer 25 moves the corresponding write data Din to another latch circuit SDL in the plane PB0. Thereafter, the sequencer 25 waits to execute a write operation on the plane PB0 until the write operation on the plane PB1 is completed.

When the write operation on the plane PB1 has completed, the sequencer 25 makes available the latch circuit XDL in the plane PB1. As a result, the latch circuit XDL in the plane PB1 may be changed from the in-use state to the unused state. Further, the sequencer 25 starts the write operation on the plane PB0 as the write operation on the plane PB1 has completed.

When the write operation on the plane PB0 has completed, the sequencer 25 releases the latch circuit XDL in the plane PB0. As a result, the latch circuit XDL in all the planes PB including the plane PB0 may be changed from the in-use state to the unused state. The logic control circuit 23 sets the signal /RB to "H" and notifies the memory controller 10 that the semiconductor storage device 20 is in a ready state.

This completes the operation of the pseudo cache program.

Further, the memory controller 10 may output the data stored in the latch circuit XDL at any time during the above-described pseudo cache program operation. To do this, the memory controller 10 issues and transmits a command "05h," a column address, and a command "E0h" to the semiconductor storage device 20. The semiconductor storage device 20 outputs the data stored in the latch circuit XDL to the memory controller 10 in response to a corresponding command sequence.

1.3 Effect of the Present Embodiment

According to the first embodiment, an increase in the latency of the write operation may be prevented. This effect will be described below.

The semiconductor storage device 20 substantially supports the cache program operation although all (e.g., two) latch circuits XDL and SDL provided in the respective sense amplifier units SAU are used in the write operation. That is, upon receiving the commands which instruct the cache program operation to be carried out on the plane PB0 ("80h" to "15h"), the sequencer 25 is configured to receive the commands which instruct the subsequent cache program operation ("80h" to "15h" or "80h" to "10h") before the use of the latch circuit XDL in the plane PB0 is completed. As a result, the logic control circuit 23 may notify the memory controller 10 that the semiconductor storage device 20 is in the ready state although the plane PB0 is executing the write operation while using the latch circuit XDL. Similarly, an operation of inputting the write data Din to the other plane PB1 into the latch circuit XDL may be executed in parallel with the write operation on the plane PB0. Therefore, an increase in the latency of the write operation may be prevented.

In the (regular) cache program operation, the logic control circuit 23 may set the signal /RB to the level "H" as long as the latch circuit XDL (through which input/output of data in the sense amplifier unit SAU is performed) is not in use, even if the sense amplifier SA and the latch circuit SDL are in use. This is because, for example, the data for next write operation can be input into the latch circuit XDL as a preparation for the next write operation regardless of whether the sense amplifier SA and the latch circuit SDL are in use or not. In the other words, in the (regular) cache program operation, the logic control circuit 23 may not set the signal /RB to the level "H" as long as the latch circuit XDL is in use. When the semiconductor storage device 20 has a small number of latch circuits (especially when there are only two latch circuits SDL and XDL as in the first embodiment), the latch circuit XDL tends to be in use until the later stage (sometimes, until the end stage) of the write operation, and therefore, the signal /RB may not be set into the level "H" until the later stage of the write operation. Therefore, the (regular) cache program operation may not be supported in the configuration like the semiconductor storage device 20 according to the first embodiment.

In the first embodiment, the semiconductor storage device 20 has plural planes PB. Each plane PB includes the memory cell array 21_1, the row decoder 21_2, and the sense amplifier module 21_3, and may perform a write operation, a read operation, and an erase operation for each plane PB. In addition, the memory system 1 provides a constraint to make the plane PB to be written in a subsequent cache program operation, be different from the plane PB to be written in the immediately preceding cache program operation. As a result, after the write data Din is input into the latch circuit XDL in a certain plane PB (e.g., the plane PB0), the sequencer 25 may regard that no new write data Din is transferred to the latch circuit XDL in that plane PB (e.g., the plane PB0) while the write operation is being executed. As a result, the sequencer 25 may pseudo-release the latch circuit XDL in the plane PB0. Therefore, the period required for inputting the write data into the other plane PB1 having the unused latch circuit XDL may be overlapped with the period required for the write operation on the plane PB0, and further, the increase in the latency of the write operation may be prevented.

In the first embodiment, descriptions have been made for the case where the latch circuit XDL is in use in the verify operation during the write operation, but the present disclosure is not limited to this. For example, even when the latch circuit XDL is in use during the program operation of the write operation, the pseudo cache program operation equivalent to that of the first embodiment may be applied and an equivalent effect may be attained.

1.4 Modifications, Etc.

In the first embodiment, descriptions have been made on the case where the latch circuit XDL is pseudo-released in the sequence of the cache program operation. However, the present disclosure is not limited to this, and various modifications may be made. For example, when another operation such as a read operation interrupts the cache program operation, the latch circuit XDL may be pseudo-released in a similar manner. In the following description, the configuration and operation similar to those of the first embodiment will be appropriately described, and the configuration and operation different from those of the first embodiment will mainly be described.

1.4.1 First Modification

Descriptions will be made on a case where a read operation causes an interrupt by issuing a command of stopping the write operation during the pseudo cache program operation.

Figure 9:
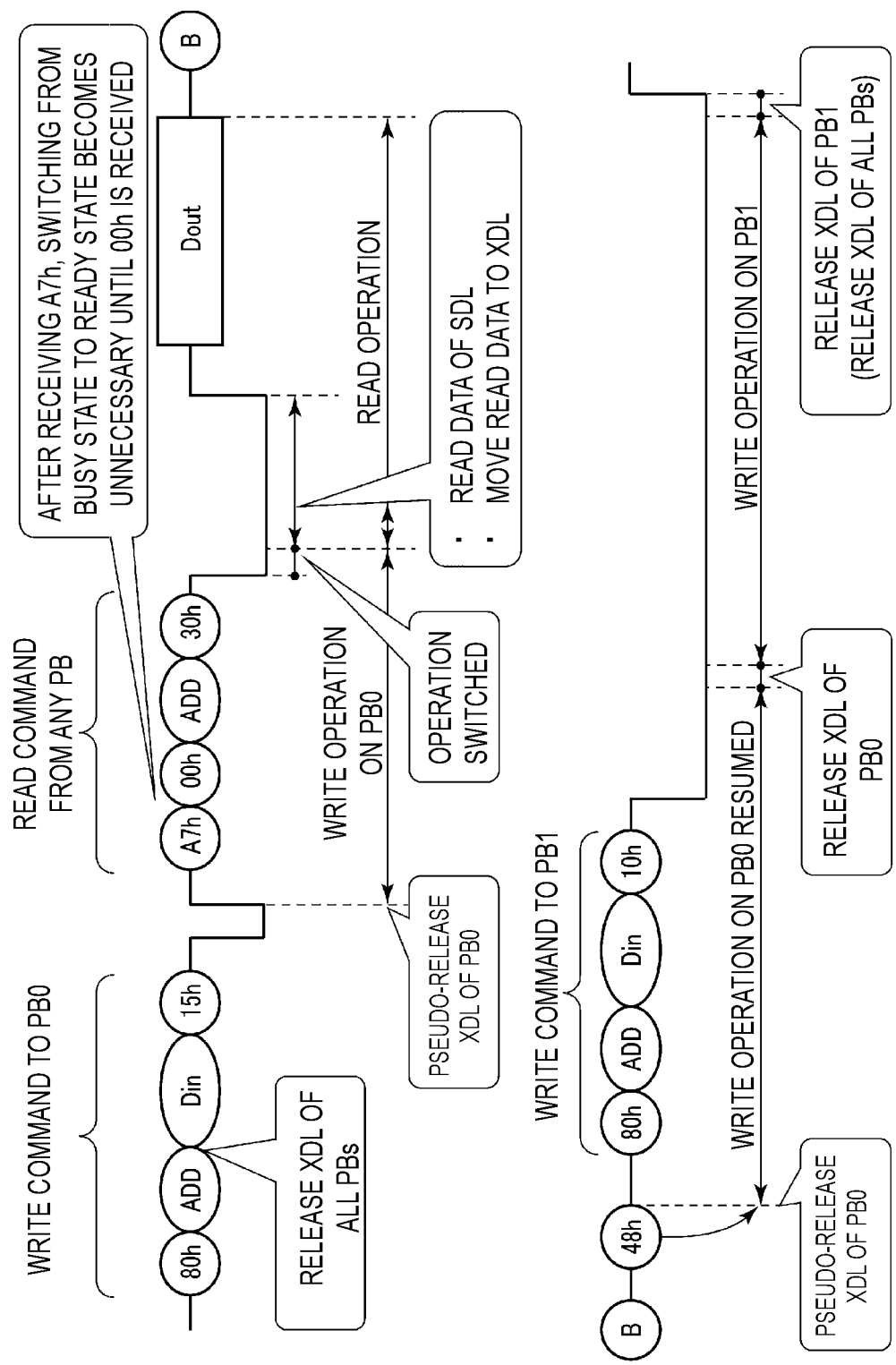
FIG. 9 is a command sequence for a pseudo cache program operation that is interrupted by a read operation in the semiconductor storage device according to a first modification of the first embodiment.

FIG. 9 is a command sequence for a pseudo cache program operation interrupted by a read operation in the semiconductor storage device according to a first modification of the first embodiment. FIG. 9 illustrates an example of a case where the read operation interrupts and is executed during the pseudo cache program operation described in FIG. 8 of the first embodiment.

As illustrated in FIG. 9, the memory controller 10 first issues and transmits the command "80h," the address ADD, the write data Din, and the command "15h" to the semiconductor storage device 20 in order to instruct the pseudo cache program operation on the plane PB0. When the address ADD is stored in the register 24, the sequencer 25 releases the latch circuits XDL in all the planes PB. When the command "15h" is stored in the register 24, the logic control circuit 23 sets the signal /RB to "L" and notifies the memory controller 10 that the semiconductor storage device 20 is in a busy state. The sequencer 25 inputs the write data Din into the corresponding latch circuit XDL in the plane PB0 and then moves the write data Din to the other latch circuit SDL in the plane PB0. Then, the sequencer 25 starts the write operation on the plane PB0.

The sequencer 25 pseudo-releases the latch circuit XDL in the plane PB0 before the write operation on the plane PB0 is completed. The logic control circuit 23 sets the signal /RB to "H" and notifies the memory controller 10 that the semiconductor storage device 20 is in a ready state.

The memory controller 10 receives an execution command of a read operation having a high priority, for example, from an external host device. Along with this, the memory controller 10 issues and transmits a command "A7h" to the semiconductor storage device 20. The command "A7h" notifies the semiconductor storage device 20 that a write operation under execution is stopped and interrupted by a new operation.

Subsequently, the memory controller 10 issues and transmits a command "00h" to the semiconductor storage device 20. The command "00h" instructs a read operation of data from the semiconductor storage device 20.

The memory controller 10 issues and transmits the address ADD (for example, over five cycles) to the semiconductor storage device 20. This address ADD specifies, for example, the address of the plane PB to be read, the block BLK, and a certain area in the block BLK. Here, the address ADD may designate any block BLK in any plane PB irrespective of the plane PB0 which is executing the write operation.

The memory controller 10 issues and transmits a command "30h" to the semiconductor storage device 20. The command "30h" causes the semiconductor storage device 20 to read data based on the address ADD transmitted immediately before. As a result, the semiconductor storage device 20 stops the write operation and starts the interrupting read operation.

Specifically, the logic control circuit 23 sets the signal /RB to level "L" and notifies the memory controller 10 that the semiconductor storage device 20 is in a busy state. The sequencer 25 stops the write operation on the plane PB0 and prepares to start the read operation. Specifically, the sequencer 25 moves the write data Din stored in the latch circuit SDL to the latch circuit XDL. Thereafter, the sequencer 25 starts the operation of reading data from the memory cell transistor MT.

After completion of the data read operation, the logic control circuit 23 sets the signal /RB to the level "H" and notifies the memory controller 10 that the semiconductor storage device 20 is in a ready state. When the semiconductor storage device 20 is in the ready state, the memory controller 10 repeatedly asserts the signal /RE. Each time the signal /RE is toggled, the read data is output to the memory controller 10.

After the output of the read data to the memory controller 10 is completed, the memory controller 10 issues and transmits a command "48h" to the semiconductor storage device 20. The command "48h" notifies the semiconductor storage device 20 to resume the stopped write operation. Upon receiving the command "48h," the sequencer 25 resumes the write operation on the plane PB0 and pseudo-releases the latch circuit XDL in the plane PB0 again. The latch circuit XDL in the plane PB0 is in use as the write operation on the plane PB0 is resumed, but the sequencer 25 does not reset the latch circuit XDL in the plane PB0, and regards the latch circuits in all the planes PB as an unused state. Therefore, the semiconductor storage device 20 remains in the ready state, and the memory controller 10 may recognize that the semiconductor storage device 20 is in a state capable of accepting a new command.

Next, the memory controller 10 issues and transmits the command "80h," the address ADD, the write data Din, and the command "10h" to the semiconductor storage device 20 in order to instruct the pseudo cache program operation on the plane PB1. When the command "10h" is stored in the register 24, the logic control circuit 23 sets the signal /RB to "L" and notifies the memory controller 10 that the semiconductor storage device 20 is in a busy state. The sequencer 25 inputs the write data Din into the corresponding latch circuit XDL in the plane PB1 and then, moves the write data Din to the other latch circuit SDL in the plane PB1. The sequencer 25 waits to execute a write operation on the plane PB1 until the write operation on the plane PB0 is completed.

When the write operation on the plane PB0 is completed, the sequencer 25 releases the latch circuit XDL in the plane PB0. As a result, the latch circuit XDL in the plane PB0 may be changed from the in-use state to the unused state. Further, the sequencer 25 starts the write operation on the plane PB1 as the write operation on the plane PB0 is completed. When the write operation on the plane PB1 is completed, the sequencer 25 releases the latch circuit XDL in the plane PB1. As a result, the latch circuit XDL in all the planes PB including the plane PB1 may be changed from the in-use state to the unused state. The logic control circuit 23 sets the signal /RB to "H" and notifies the memory controller 10 that the semiconductor storage device 20 is in a ready state.

With the above operation, the pseudo cache program operation that was interrupted by the read operation ends.

Further, as described above, the latch circuit XDL is connected in series between the sense amplifier SA and the input/output circuit 22. Thus, it is necessary to pass through the latch circuit XDL in order to output the data read from the memory cell transistor MT to the memory controller 10. Therefore, when the plane PB to be read is the same as the plane PB in which the write operation is stopped (i.e., the plane PB0 in the case of FIG. 9), there is a possibility that the write data Din may be stored in the latch circuit XDL. Therefore, there is a possibility that the write data Din and read data may collide with each other in the latch circuit XDL.

Figure 10:
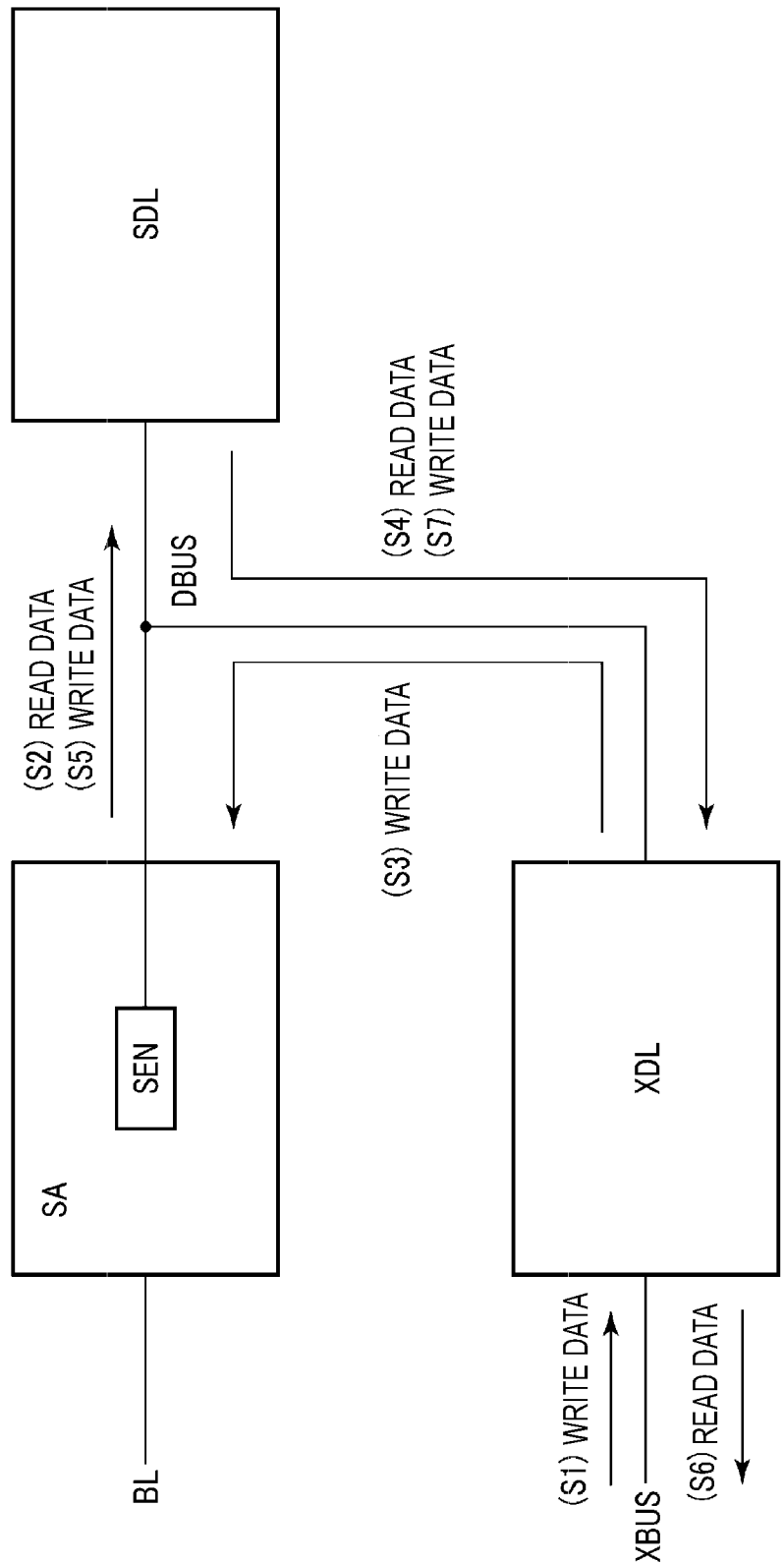
FIG. 10 is a schematic diagram illustrating data movement configured to avoid data collisions in the sense amplifier unit in the semiconductor storage device according to the first modification of the first embodiment.

FIG. 10 is a schematic diagram illustrating data movement performed to avoid data collision in the sense amplifier unit in the semiconductor storage device according to the first modification of the first embodiment. FIG. 10 illustrates a case where the write operation on the plane PB0 is executed and interrupted by the data read operation on the plane PB0.

As illustrated in FIG. 10, in step S1, the sequencer 25 first stores the write data Din in the latch circuit XDL.

Subsequently, in step S2, the sequencer 25 reads the data by sensing the threshold voltage of the memory cell transistor MT to be read at a node SEN, and stores the read data in the latch circuit SDL.

In step S3, the sequencer 25 stores the write data Din stored in the latch circuit XDL at the node SEN in the sense amplifier SA.

In step S4, the sequencer 25 stores the read data stored in the latch circuit SDL in the latch circuit XDL.

In step S5, the sequencer 25 stores the write data Din which is stored at the node SEN in the latch circuit SDL.

In step S6, the sequencer 25 outputs the read data transferred to the latch circuit XDL to the memory controller 10.

In step S7, the sequencer 25 stores the write data Din which is stored in the latch circuit SDL in the latch circuit XDL.

With the above-described operations, data may be read without losing the write data Din even when the plane PB in which the write operation is stopped and the plane PB to be read are the same.

In FIG. 10, descriptions have been made on the case where the plane PB in which the write operation is stopped and the plane PB to be read are the same, but the present disclosure is not limited to this. That is, the plane PB in which the write operation is stopped may be different from the plane PB to be read. In this case, it is not necessary to consider the possibility that the write data Din and the read data may collide with each other in the latch circuit XDL. Therefore, the sequencer 25 may output the read data to the memory controller 10 according to the sequence in which the steps S1, S3, S5, and S7 in the example of FIG. 10 are omitted (i.e., according to the sequence of steps S2, S4, and S6).

According to the first modification of the first embodiment, as in the first embodiment, the sequencer 25 pseudo-releases the latch circuit XDL in the plane PB0 during the execution of the write operation on the plane PB0. As a result, the logic control circuit 23 may set the signal /RB to the level "H." For this reason, the memory controller 10 may transmit the command "A7h" to the semiconductor storage device 20 when the semiconductor storage device 20 is in a ready state. Therefore, the time required until the read operation is started may be reduced.

When the write operation is not a write operation using the pseudo cache program operation, the semiconductor storage device 20 is in a busy state during the write operation on the plane PB0. When interrupted by the read operation in this state, the sequencer 25 needs to receive the command "A7h" in a busy state. Since the sequencer 25 needs to execute a processing to change the setting in the semiconductor storage device 20 to the ready state in order to receive a new read command "00h," there is a possibility that the latency of the read operation may increase.

According to the first modification of the first embodiment, since the sequencer 25 may receive the command "A7h" because it is in the ready state, the processing of changing the setting from the busy state to the ready state described above becomes unnecessary. Therefore, an increase in the latency of the read operation may be prevented.

1.4.2 Second Modification

Next, descriptions will be made on an operation when the read operation is executed to interrupt the pseudo cache program operation in which the write data Din is input into the latch circuit XDL.

Figure 11:
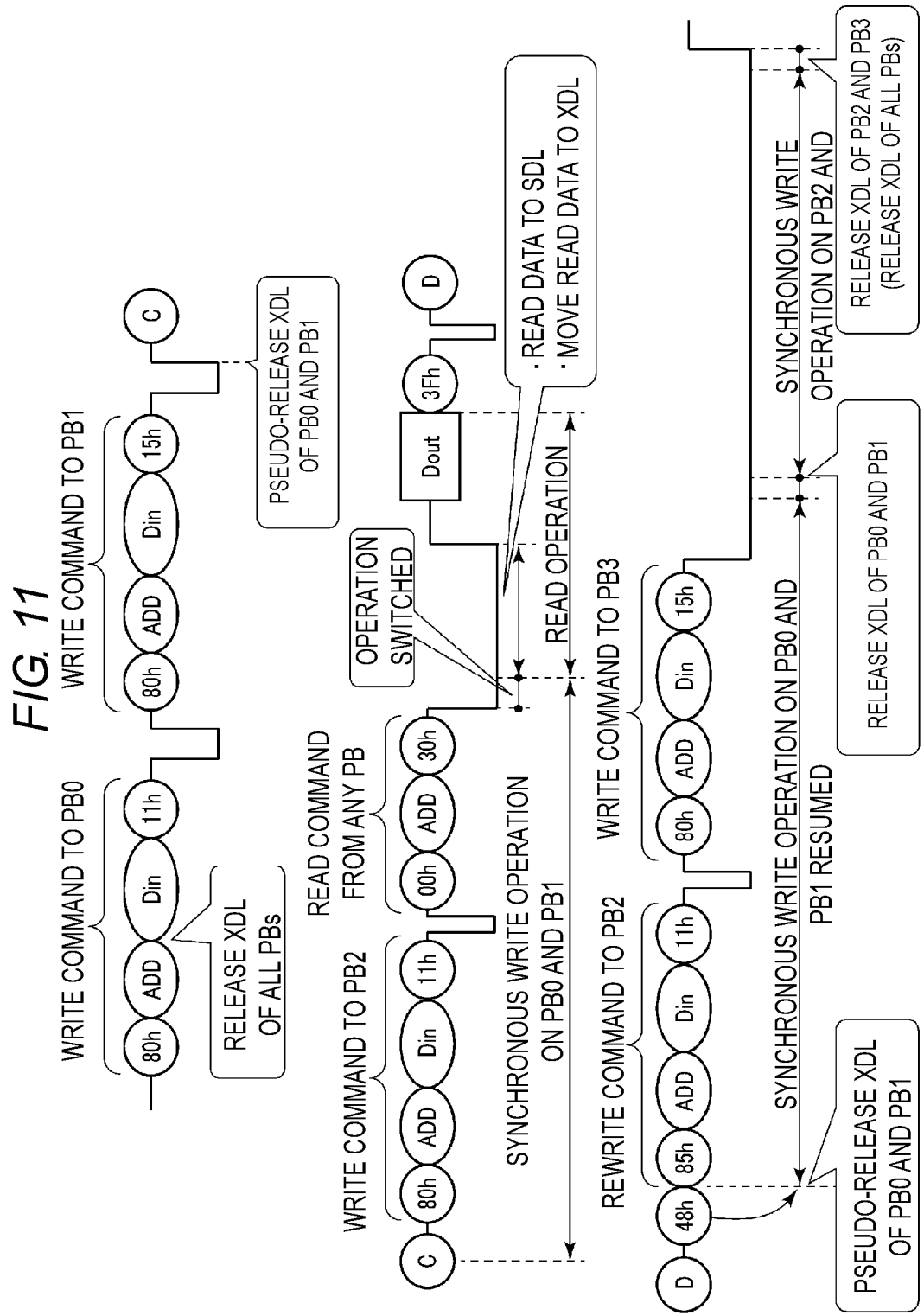
FIG. 11 is a command sequence for a pseudo cache program operation that is interrupted by a read operation in the semiconductor storage device according to a second modification of the first embodiment.

FIG. 11 is a command sequence for a pseudo cache program operation interrupted by a read operation in the semiconductor storage device according to a second modification of the first embodiment. FIG. 11 illustrates a case where a pseudo cache program operation is executed for a write operation in which plural planes PB are synchronized. More specifically, FIG. 11 illustrates, as an example, a case where the write operation in which the write operations to the planes PB0 and PB1 are executed synchronously and the write operation in which the write operations to the planes PB2 and PB3 are executed synchronously are executed alternately in accordance with the sequence of the pseudo cache program operation. FIG. 11 also illustrates an example of the operation when the read operation interrupts the write operation during which the write data Din is input into the latch circuit XDL.

As illustrated in FIG. 11, the memory controller 10 first issues and transmits the command "80h," the address ADD, the write data Din, and the command "11h to the semiconductor storage device 20 in order to instruct a write operation on the plane PB0. The command "11h" causes the semiconductor storage device 20 to execute the write operations to plural plane PBs synchronously. When the address ADD is stored in the register 24, the sequencer 25 releases the latch circuits XDL in all the planes PB. When the command "11h" is stored in the register 24, the logic control circuit 23 sets the signal /RB to "L" and notifies the memory controller 10 that the semiconductor storage device 20 is in a busy state. The sequencer 25 inputs the write data Din into the corresponding latch circuit XDL in the plane PB0 and then, moves the write data Din to the other latch circuit SDL in the plane PB0. The logic control circuit 23 sets the signal /RB to the level "H," notifies the memory controller 10 that the semiconductor storage device 20 is in a ready state, and waits for a command that instructs the write operation to be synchronized with the plane PB0.

The memory controller 10 issues and transmits the command "80h," the address ADD, the write data Din, and the command "15h to the semiconductor storage device 20 in order to instruct a write operation on the plane PB1. When the command "15h" is stored in the register 24, the logic control circuit 23 sets the signal /RB to "L" and notifies the memory controller 10 that the semiconductor storage device 20 is in a busy state. The sequencer 25 inputs the write data Din into the corresponding latch circuit XDL in the plane PB1 and then, moves the write data Din to the other latch circuit SDL in the plane PB1. Then, the sequencer 25 starts the synchronous write operation on the planes PB0 and PB1 when the input of the write data Din is completed.

The sequencer 25 pseudo-releases the latch circuit XDL in the planes PB0 and PB1 before the synchronous write operation on the planes PB0 and PB1 is completed. The logic control circuit 23 sets the signal /RB to "H" and notifies the memory controller 10 that the semiconductor storage device 20 is in a ready state.

Subsequently, the memory controller 10 issues and transmits the command "80h," the address ADD, the write data Din, and the command "11h" to the semiconductor storage device 20 in order to instruct a write operation on the plane PB 2. When the command "11h" is stored in the register 24, the logic control circuit 23 sets the signal /RB to "L" and notifies the memory controller 10 that the semiconductor storage device 20 is in a busy state. The sequencer 25 inputs the write data Din into the corresponding latch circuit XDL in the plane PB2 and then, moves the write data Din to the other latch circuit SDL in the plane PB2. The logic control circuit 23 sets the signal /RB to the level "H," notifies the memory controller 10 that the semiconductor storage device 20 is in a ready state, and waits for a command that instructs the write operation to be synchronized with the plane PB2.

The memory controller 10 receives an execution command of a read operation having a high priority from an external host device, for example, before the input of the write data Din into the latch circuit XDL in the plane PB2 is completed. Along with this, the memory controller 10 issues and transmits the command "00h," the address ADD, and the command "30h" to the semiconductor storage device 20. As a result, the semiconductor storage device 20 stops the input of the write data Din into the latch circuit XDL and starts an operation to interrupt.

Specifically, the logic control circuit 23 sets the signal /RB to the level "L" and notifies the memory controller 10 that the semiconductor storage device 20 is in a busy state. The sequencer 25 stops the synchronous write operation on the planes PB0 and PB1 and prepares to start the read operation. Specifically, for example, the sequencer 25 may transmit the write data Din, which has already been input and stored in the latch circuit SDL, to the latch circuit XDL again. Thereafter, the sequencer 25 starts the operation of reading data from the memory cell transistor MT.

Further, when the plane PB to be read is the plane PB0 or PB1 which needs to stop the synchronous write operation or the plane PB2 which needs to stop the input of the write data Din, there is a possibility that the write data Din and read data may collide with each other in the latch circuit XDL. In this case, for example, a method equivalent to that in FIG. 10 according to the first modification of the first embodiment may be applied as a method of moving data in the sense amplifier unit SAU, and thus, descriptions thereof are omitted.

After completion of the data read operation, the logic control circuit 23 sets the signal /RB to the level "H" and notifies the memory controller 10 that the semiconductor storage device 20 is in a ready state. When the semiconductor storage device 20 is in a ready state, the memory controller 10 repeatedly asserts the signal /RE. Each time the signal /RE is toggled, the read data is output to the memory controller 10.

After the output of the read data to the memory controller 10 is completed, the memory controller 10 issues and transmits a command "3Fh" to the semiconductor storage device 20. The command "3Fh" instructs transfer of a portion of the write data Din stored in the latch circuit SDL to the latch circuit XDL. Upon receiving the command "3Fh," the sequencer 25 transfers the input write data Din from the latch circuit SDL to the latch circuit XDL. As a result, the sense amplifier unit SAU may be returned to the state immediately before the interruption by the read operation.

Subsequently, the memory controller 10 issues and transmits the command "48h" to the semiconductor storage device 20. Upon receiving the command "48h," the sequencer 25 resumes the synchronous write operation on the planes PB0 and PB1 and pseudo-releases the latch circuits XDL in the planes PB0 and PB1 again. The latch circuits XDL in the plane PB0 and the plane PB1 are in use as the synchronous write operation on the plane PB0 and the plane PB1 is resumed, but the sequencer 25 does not reset the latch circuits XDL in the plane PB0 and the plane PB1, and regards the latch circuits in all the planes PB as an unused state. Therefore, the semiconductor storage device 20 remains in the ready state, and the memory controller 10 may recognize that the semiconductor storage device 20 is in a state capable of accepting a new command.

The memory controller 10 issues and transmits the command "85h," the address ADD, the write data Din, and the command "11h" to the semiconductor storage device 20. The command "85h" notifies the semiconductor storage device 20 that the stopped input of the write data Din is resumed. In addition, the write data Din may include data that has not been input into the latch circuit XDL in the plane PB2 before the stopping due to the read operation. The sequencer 25 inputs the write data Din into the corresponding latch circuit XDL in the plane PB2 and then, moves the write data Din to the other latch circuit SDL in the plane PB2. The logic control circuit 23 sets the signal /RB to the level "H," notifies the memory controller 10 that the semiconductor storage device 20 is in a ready state, and waits for a command that instructs the write operation to be synchronized with the plane PB2.

Next, the memory controller 10 issues and transmits the command "80h," the address ADD, the write data Din, and the command "15h" to the semiconductor storage device 20 in order to instruct the pseudo cache program operation on the plane PB3. When the command "15h" is stored in the register 24, the logic control circuit 23 sets the signal /RB to "L" and notifies the memory controller 10 that the semiconductor storage device 20 is in a busy state. The sequencer 25 inputs the write data Din into the corresponding latch circuit XDL in the plane PB3 and then, moves the write data Din to the other latch circuit SDL in the plane PB3. The sequencer 25 waits for the synchronous write operation on the planes PB2 and PB3 until the synchronous write operation on the planes PB0 and PB1 is completed.

When the synchronous write operation on the planes PB0 and PB1 is completed, the sequencer 25 releases the latch circuits XDL in the planes PB0 and PB1. As a result, the latch circuits XDL in the planes PB0 and PB1 may be changed from the in-use state to the unused state. In addition, as the synchronous write operation on the planes PB0 and PB1 is completed, the sequencer 25 starts the synchronous write operation on the planes PB2 and PB3. When the synchronous write operation on the planes PB2 and PB3 is completed, the sequencer 25 releases the latch circuits XDL in the planes PB2 and PB3. As a result, the latch circuits XDL in all the planes PB including the planes PB2 and PB3 may be changed from the in-use state to the unused state. The logic control circuit 23 sets the signal /RB to "H" and notifies the memory controller 10 that the semiconductor storage device 20 is in a ready state.

With the above operation, the pseudo cache program operation that interrupts the read operation ends.

According to the second modification of the first embodiment, the sequencer 25 pseudo-releases the latch circuits XDL in the planes PB0 and PB1 during the execution of the synchronous write operation on the planes PB0 and PB1. As a result, it is possible to execute the synchronous write operation on the planes PB0 and PB1 and to input the write data Din into the latch circuits XDL in the planes PB2 and PB3. Therefore, it is possible to prevent an increase in the latency of the synchronous write operation on the planes PB2 and PB3. In addition, when an interruption of the read operation occurs in response to the synchronous write operation on the planes PB2 and PB3, it is also possible to prevent an increase in the latency of the read operation.

In the second modification described above, descriptions have been made on the case where the read command is issued during the input of the write data Din into the latch circuit XDL in the plane PB2, but the present disclosure is not limited to this. For example, the read command may be issued after the input of the write data Din into the latch circuit XDL in the plane PB2 is completed and until the write command on the plane PB3 is issued.

Further, in the above-described second modification, descriptions have been made on the case where the read operation interrupts when the pseudo cache program operation is executed for the synchronous write operation on the plural planes PB, but the present disclosure is not limited to this. For example, the operation according to the second modification may be similarly applied to a case where, when the pseudo cache program operation is executed for the write operation on one plane PB, the read operation is interrupted as in the first embodiment and the first modification.

Hereinafter, still another modification to the second modification as described above will be described with reference to FIG. 12.

Figure 12:
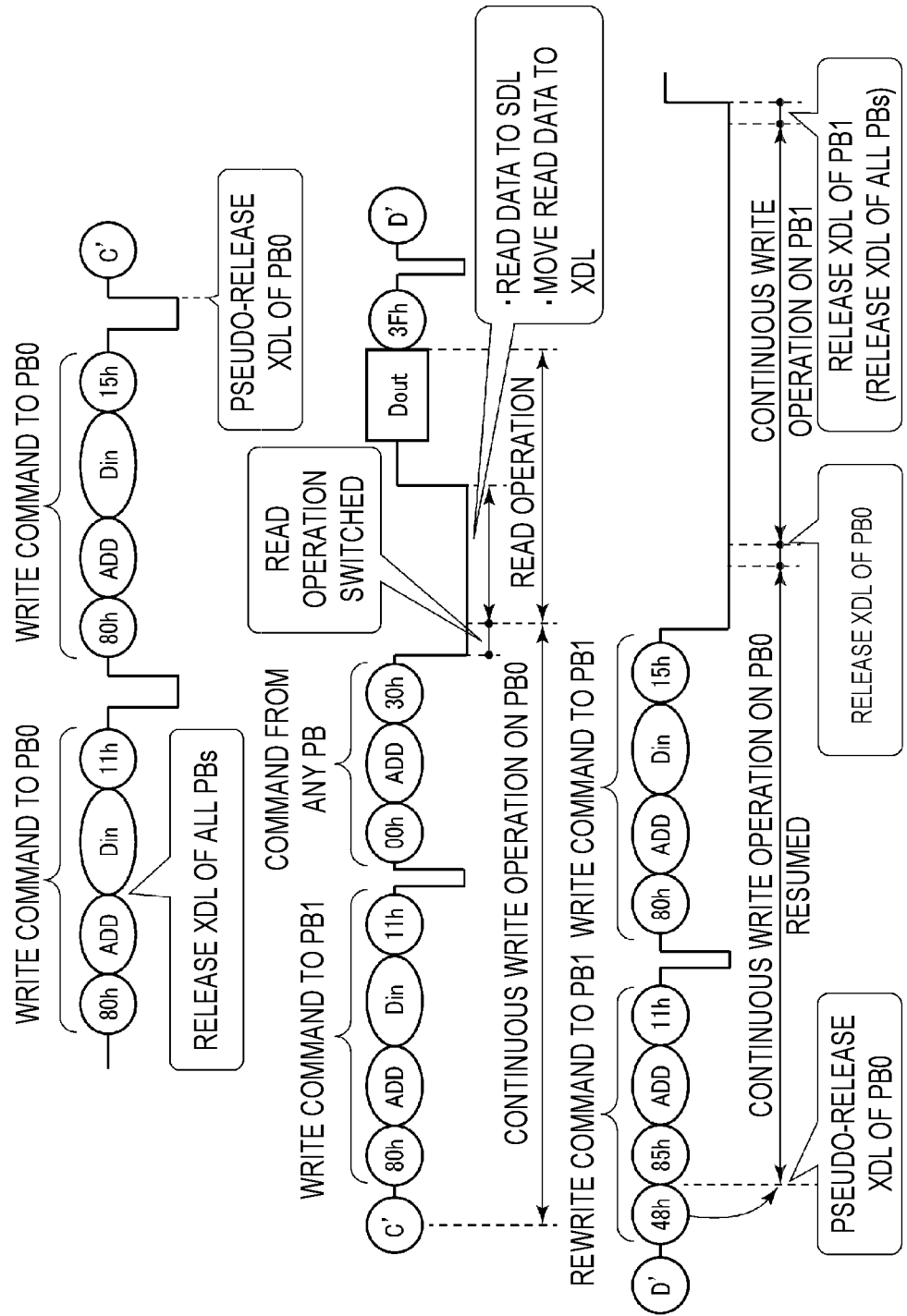
FIG. 12 is a command sequence for a pseudo cache program operation that is interrupted by a read operation in the semiconductor storage device according to yet another modification of the second modification of the first embodiment.

FIG. 12 is a command sequence for a pseudo cache program operation accompanied by a read operation executed by an interruption in the semiconductor storage device according to still another modification of the second modification. FIG. 12 illustrates a case where the pseudo cache program operation is executed for the write operation on one plane, not the write operation in which the plural planes PB are synchronized. More specifically, FIG. 12 illustrates, as an example, a case where the write operation executed to the plane PB0 and the write operation executed to the plane PB1 are alternately executed in accordance with the sequence of the pseudo cache program operation. FIG. 12 illustrates an example of the operation when the read operation is interrupted after completion of the input of the write data Din into the latch circuit XDL in the write operation.

As illustrated in FIG. 12, the memory controller 10 first issues and transmits the command "80h," the address ADD, the write data Din, and the command "11h" to the semiconductor storage device 20 in order to instruct a write operation on the plane PB0. The command "11h" notifies the semiconductor storage device 20 that a new write command is subsequently issued. When the address ADD is stored in the register 24, the sequencer 25 releases the latch circuits XDL in all the planes PB. When the command "11h" is stored in the register 24, the logic control circuit 23 sets the signal /RB to "L" and notifies the memory controller 10 that the semiconductor storage device 20 is in a busy state. The sequencer 25 inputs the write data Din into the corresponding latch circuit XDL in the plane PB0 and then, moves the write data Din to the other latch circuit SDL in the plane PB0. The logic control circuit 23 sets the signal /RB to the level "H," notifies the memory controller 10 that the semiconductor storage device 20 is in a ready state, and waits for a command that instructs continuous write operations to the plane PB0.

The memory controller 10 issues and transmits the command "80h," the address ADD, the write data Din, and the command "15h" to the semiconductor storage device 20 in order to instruct a new write operation on the plane PB0. When the command "15h" is stored in the register 24, the logic control circuit 23 sets the signal /RB to "L" and notifies the memory controller 10 that the semiconductor storage device 20 is in a busy state. The sequencer 25 inputs the write data Din into the corresponding latch circuit XDL in the plane PB0 and then, moves the write data Din to the other latch circuit SDL in the plane PB0. Then, when the input of the write data Din is completed, the sequencer 25 starts a write operation on the plane PB0.

The sequencer 25 pseudo-releases the latch circuit XDL in the plane PB0 before the write operation on the plane PB0 is completed. The logic control circuit 23 sets the signal /RB to "H" and notifies the memory controller 10 that the semiconductor storage device 20 is in a ready state.

Subsequently, the memory controller 10 issues the command "80h," the address ADD, the write data Din, and the command "11h" to the semiconductor storage device 20 in order to instruct a write operation on the plane PB1. When the command "11h" is stored in the register 24, the logic control circuit 23 sets the signal /RB to "L" and notifies the memory controller 10 that the semiconductor storage device 20 is in a busy state. The sequencer 25 inputs the write data Din into the corresponding latch circuit XDL in the plane PB1 and then, moves the write data Din to the other latch circuit SDL in the plane PB1. The logic control circuit 23 sets the signal /RB to the level "H" irrespective of whether the input of the write data Din into the latch circuit XDL is completed, and notifies to the memory controller 10 that the semiconductor storage device 20 is in a ready state, and waits for a command that instructs a new write operation.

After the input of the write data Din, for example, into the latch circuit XDL in the plane PB1 is completed, the memory controller 10 receives an instruction to execute a read operation having a high priority from an external host device before a command that instructs a new write operation is issued. Along with this, the memory controller 10 issues and transmits the command "00h," the address ADD, and the command "30h" to the semiconductor storage device 20. As a result, the semiconductor storage device 20 stops the input of the write data Din into the latch circuit XDL and starts an operation to interrupt.

The processing of the interrupting read operation is the same as in the case of FIG. 11, and thus, descriptions thereof will be omitted.

After the output of the read data to the memory controller 10 is completed, the memory controller 10 issues and transmits the command "3Fh" to the semiconductor storage device 20. Upon receiving the command "3Fh," the sequencer 25 transfers the input write data Din from the latch circuit SDL to the latch circuit XDL before the read operation. As a result, the sense amplifier unit SAU may be returned to the state immediately before the interruption of the read operation occurs.

Subsequently, the memory controller 10 issues and transmits the command "48h" to the semiconductor storage device 20. Upon receiving the command "48h," the sequencer 25 resumes the write operation on the plane PB0 and pseudo-releases the latch circuit XDL in the plane PB0 again. The latch circuit XDL in the plane PB0 is in use as the continuous write operation on the plane PB0 is resumed, but the sequencer 25 does not reset the latch circuit XDL in the plane PB0, and regards the latch circuit in the plane PB as an unused state. Therefore, the semiconductor storage device 20 remains in the ready state, and the memory controller 10 may recognize that the semiconductor storage device 20 is in a state capable of accepting a new command.

The memory controller 10 issues and transmits the command "85h," the address ADD, and the command "11h" to the semiconductor storage device 20. In the example of FIG. 12, the write data Din is not transmitted again because all inputs into the latch circuit XDL in the plane PB1 have been completed before the stopping due to the read operation. Upon receiving the command "11h," the logic control circuit 23 sets the signal /RB to the level "H," notifies the memory controller 10 that the semiconductor storage device 20 is in a ready state, and waits for a command that instructs a new write operation.

Next, the memory controller 10 issues and transmits the command "80h," the address ADD, the write data Din, and the command "15h" to the semiconductor storage device 20 in order to instruct a new write operation on the plane PB1. When the command "15h" is stored in the register 24, the logic control circuit 23 sets the signal /RB to "L" and notifies the memory controller 10 that the semiconductor storage device 20 is in a busy state. The sequencer 25 inputs the write data Din into the corresponding latch circuit XDL in the plane PB1 and then, moves the write data Din to the other latch circuit SDL in the plane PB1. The sequencer 25 waits to execute a write operation on the plane PB1 until the write operation on the plane PB0 has completed.

When the write operation on the plane PB0 is completed, the sequencer 25 releases the latch circuit XDL in the plane PB0. As a result, the latch circuit XDL in the plane PB0 may be changed from the in-use state to the unused state. Further, the sequencer 25 starts the write operation on the plane PB1 as the write operation on the plane PB0 is completed. When the write operation on the plane PB1 is completed, the sequencer 25 releases the latch circuit XDL in the plane PB1. As a result, the latch circuits XDL in all the planes PB including the plane PB1 may be changed from the in-use state to the unused state. The logic control circuit 23 sets the signal /RB to "H" and notifies the memory controller 10 that the semiconductor storage device 20 is in a ready state.

With the above-described operation, the pseudo cache program operation that interrupts the read operation ends.

2. Others

The present disclosure is not limited to the above-described first embodiment, the first modification and the second modification, and various modifications are applicable. For example, in the first embodiment and the first modification described above, descriptions have been made on the pseudo cache program operation that executes the write operation of the plane PB0 and the write data input operation of the plane PB1 in parallel. In the second modification described above, descriptions have been made on the pseudo cache program operation that executes the synchronous write operation of the planes PB0 and PB1 and the write data input operation of the planes PB2 and PB3 in parallel. However, the present disclosure is not limited to this, and the pseudo cache program operation is executable for a synchronous write operation of a set of any number of planes (e.g., three, four, eight, etc.). More specifically, for example, when a pseudo cache program operation is applied to a synchronous write operation of a set of four planes, the synchronous write operation of the planes PB0 to PB3 and the write data input operation of the planes PB4 to PB7 may be executed in parallel.

In the first embodiment described above, descriptions have been made on an example in which the memory system 1 provides a constraint to make the plane PB to be written in a subsequent cache program operation different from the plane PB to be written in the immediately preceding cache program operation. This constraint may be given in association with a set of planes capable of executing a synchronous write operation. For example, in the semiconductor storage device 20 illustrated in FIG. 1, when the planes PB0 to PB3, the planes PB4 to PB7, the planes PB8 to PB11, and the planes PB12 to PB15 are each a set of planes that is capable of executing the synchronous write operation, and when a cache program operation is executed on at least one of the planes PB0 to PB3, a constraint may be provided so that the target of the subsequent cache program operation is at least one of the planes PB4 to PB7.

In the first embodiment, the first modification, and the second modification described above, descriptions have been made on a case where only two latch circuits SDL and XDL are provided in the sense amplifier unit SAU, but the present disclosure is not limited to this. For example, even when additional latch circuits other than the latch circuits SDL and XDL are provided, during a write operation in which the latch circuit XDL is in use, the same effect as described above may be achieved by the pseudo cache program operation described above.

Also, in the second modification described above, descriptions have been made on the case where the write command "80h" that instructs a write operation on a cell unit CU is issued, but the present disclosure is not limited to this. For example, "85h" may be issued instead of the write command "80h." "85h" is a write command capable of instructing a write operation to a column address of any size in the cell unit CU.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanied by claims and their equivalents are intended to cover such forms or modifications as would fall within the scope and spirit of the inventions.

What is claimed is:

1. A semiconductor storage device comprising:
   a first plane and a second plane each including a memory cell array that includes a plurality of memory cells;
   an input/output circuit configured to receive data to be written in the memory cells from a controller; and
   a control circuit, wherein
   the first plane further includes a first sense amplifier circuit electrically connected to a first memory cell of the first plane and a first latch circuit connected in series between the input/output circuit and the first sense amplifier circuit, and
   the control circuit is configured to carry out a first write operation on the first memory cell using the first latch circuit in response to a first command, and while carrying out the first write operation on the first memory cell, accept a second command to carryout a second write operation on a second memory cell of the second plane before use of the first latch circuit during the first write operation has ended.

2. The semiconductor storage device according to claim 1, wherein
   while carrying out the first write operation on the first memory cell and prior to accepting the second command, the control circuit pseudo-releases the first latch circuit.

3. The semiconductor storage device according to claim 1, wherein
   while carrying out the first write operation on the first memory cell and prior to accepting the second command, the control circuit notifies the controller that the control circuit is capable of receiving a command without resetting data in the first latch circuit.

4. The semiconductor storage device according to claim 3, wherein the control circuit is configured to reset the data in the first latch circuit after the first write operation is completed.

5. The semiconductor storage device according to claim 4, further comprising:
   a third plane including a memory cell array that includes a plurality of memory cells, wherein
   the second plane further includes a second sense amplifier circuit electrically connected to the second memory cell and a second latch circuit connected in series between the input/output circuit and the second sense amplifier circuit, and
   the control circuit is configured to, after accepting the second command and the first write operation has completed and before use of the second latch circuit during the second write operation has ended, accept a third command to carry out a third write operation on a third memory cell in the first plane or the third plane.

6. The semiconductor storage device according to claim 5, wherein
   while carrying out the second write operation on the second memory cell and prior to accepting the third command, the control circuit pseudo-releases the second latch circuit.

7. The semiconductor storage device according to claim 5, wherein
   while carrying out the second write operation on the second memory cell and prior to accepting the third command, the control circuit notifies the controller that the control circuit is capable of receiving a command without resetting data in the second latch circuit.

8. The semiconductor storage device according to claim 1, wherein
   while carrying out the first write operation on the first memory cell and before use of the first latch circuit during the first write operation has ended, the control circuit, in response to a fourth command, stops the first write operation and executes a read operation on the first plane or the second plane.

9. The semiconductor storage device according to claim 8, wherein the fourth command is a high priority read command.

10. The semiconductor storage device according to claim 8, wherein
    while carrying out the first write operation on the first memory cell and prior to accepting the fourth command, the control circuit pseudo-releases the first latch circuit.

11. The semiconductor storage device according to claim 1, wherein
    the first plane further includes a second latch circuit and
    if a read operation is executed on the first plane in response to a fourth command, the control circuit stores read data in a second latch circuit, followed by transferring of write data stored in the first latch circuit to a sense node of the first sense amplifier circuit, transferring of the read data stored in the second latch circuit to the first latch circuit, transferring of the write data transferred to the sense node to the second latch circuit, transferring of the read data in the first latch circuit to the input/output circuit, and then transferring of the write data in the second latch circuit to the first latch circuit.

12. The semiconductor storage device according to claim 1, wherein
    the second plane further includes a second sense amplifier circuit electrically connected to the second memory cell and a second latch circuit connected in series between the input/output circuit and the second sense amplifier circuit, and
    the controller is configured to, after accepting the second command, upon receiving a sixth command before receiving a fifth command to carry out a new write operation, stop the first write operation and execute a read operation on the first plane or the second plane.

13. The semiconductor storage device according to claim 12, wherein the sixth command is a high priority read command.

14. The semiconductor storage device according to claim 1, wherein the first command and the second command each includes a set of first type write commands, and a first period required for the semiconductor storage device to accept the first command and return to a ready state is shorter than a second period required for the semiconductor storage device to accept the second command and return to the ready state.

15. A semiconductor storage device comprising:

a first plane and a second plane each including a memory cell array that includes a plurality of memory cells;

a third plane and a fourth plane each including a memory cell array that includes a plurality of memory cells;

an input/output circuit configured to receive data to be written in the memory cells from a controller; and a control circuit configured to perform a write operation on the first and second planes synchronously in response to first and second commands and a write operation on the first and second planes synchronously in response to third and fourth commands, wherein the first plane further includes a first sense amplifier circuit electrically connected to a first memory cell of the first plane and a first latch circuit connected in series between the input/output circuit and the first sense amplifier circuit, the second plane further includes a second sense amplifier circuit electrically connected to a second memory cell of the second plane and a second latch circuit connected in series between the input/output circuit and the second sense amplifier circuit, and the control circuit is configured to carry out the write operation on the first memory cell and the second memory cell synchronously using the first latch circuit and the second latch circuit, respectively, and while carrying out the write operation, accept the third command before use of the first latch circuit and the second latch circuit during the write operation has ended.

16. The semiconductor storage device according to claim 15, wherein while carrying out the write operation on the first memory cell and the second memory cell synchronously and prior to accepting the third command, the control circuit pseudo-releases the first latch circuit and the second latch circuit.

17. The semiconductor storage device according to claim 15, wherein while carrying out the write operation on the first memory cell and the second memory cell synchronously and prior to accepting the third command, the control circuit notifies the controller that the control circuit is capable of receiving a command without resetting data in the first latch circuit and the second latch circuit.

18. The semiconductor storage device according to claim 17, wherein the control circuit is configured to reset the data in the first latch circuit and the second latch circuit after the write operation is completed.

19. A method of performing operations on a semiconductor storage device having first and second planes, each including a plurality of memory cells, and an input/output circuit configured to receive data to be written in the memory cells from a controller, wherein the first plane further includes a first sense amplifier circuit electrically connected to a first memory cell of the first plane, and a first latch circuit connected in series between the input/output circuit and the first sense amplifier circuit, said method comprising:

performing a first operation on the first memory cell using the first latch circuit in response to a first command; and while carrying out the first operation on the first memory cell, accepting a second command to carry out a second operation on a second memory cell of the second plane before use of the first latch circuit during the first operation has ended.

20. The method of claim 19, wherein the first operation is a write operation and the second operation is either a write operation or a read operation.

* * * * *